(12) United States Patent
Nakamura et al.

(10) Patent No.: US 8,014,443 B2
(45) Date of Patent: Sep. 6, 2011

(54) NON-LINEAR DISTORTION DETECTION METHOD AND DISTORTION COMPENSATION AMPLIFYING DEVICE

(75) Inventors: Manabu Nakamura, Tokyo (JP); Yasuhiro Takeda, Tokyo (JP); Yoichi Okubo, Tokyo (JP); Masaru Adachi, Tokyo (JP); Naoki Hongo, Tokyo (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 746 days.

(21) Appl. No.: 12/078,507

(22) Filed: Apr. 1, 2008

(65) Prior Publication Data

US 2008/0187035 A1    Aug. 7, 2008

Related U.S. Application Data

(63) Continuation of application No. PCT/JP2006/320642, filed on Oct. 17, 2006.

(30) Foreign Application Priority Data

Oct. 17, 2005  (JP) ................ P2005-301671
Apr. 21, 2006  (JP) ................ P2006-117452

(51) Int. Cl.
  *H03H 7/30*  (2006.01)
  *H03F 1/26*  (2006.01)
(52) U.S. Cl. ........................ 375/232; 330/149
(58) Field of Classification Search .............. 375/298, 375/232, 295, 230, 229; 330/149
See application file for complete search history.

(56) References Cited

U.S. PATENT DOCUMENTS

| 2001/0014592 A1* | 8/2001 | Helms ..................... 455/91 |
| 2003/0198165 A1* | 10/2003 | Mouri et al. ............... 369/53.35 |
| 2005/0089125 A1 | 4/2005 | Zhidkov |
| 2005/0099230 A1 | 5/2005 | Shandbhag |
| 2005/0163249 A1 | 7/2005 | McCallister |
| 2005/0163250 A1 | 7/2005 | McCallister |

FOREIGN PATENT DOCUMENTS

| CN | 1453782 | 11/2003 |
| CN | 1510832 | 7/2004 |
| JP | 09-069733 | 3/1997 |

(Continued)

OTHER PUBLICATIONS

Chinese Examination Report.

(Continued)

*Primary Examiner* — David C. Payne
*Assistant Examiner* — Brian J Stevens
(74) *Attorney, Agent, or Firm* — Jacobson Hollman PLLC

(57) ABSTRACT

The present invention provides a non-linear distortion detection method and a distortion compensation amplifying device capable of suppressing increase of the circuit size and the power consumption even if the signal band is widened. A signal obtained by feeding back an output of a power amplifier is sampled by an A/D converter. An equalizer of a distortion detection unit uses an input signal d(n) of a predistorter as a reference symbol to detect an equalization error e(n) of the orthogonal demodulation signal u(n). An absolute value averaging unit outputs an absolute value of the equalization error e(n) which has been temporally averaged to E(n) as a distortion value to a control unit. According to the distortion value, the control unit adaptively controls the predistorter to perform distortion compensation.

7 Claims, 22 Drawing Sheets

FOREIGN PATENT DOCUMENTS

| | | |
|---|---|---|
| JP | 2002-050933 | 2/2002 |
| JP | 2004-005893 | 1/2004 |
| JP | 2004-120451 | 4/2004 |
| JP | 2004-165900 | 6/2004 |
| JP | 2005-005781 | 1/2005 |
| JP | 2005-020515 | 1/2005 |
| JP | 2005-065211 | 3/2005 |
| JP | 2005-073032 | 3/2005 |
| JP | 2005-102029 | 4/2005 |
| JP | 2005-117599 | 4/2005 |
| WO | WO 01/31778 | 5/2001 |
| WO | WO 03/065599 | 8/2003 |

OTHER PUBLICATIONS

Ding et al., *"Memory Polynomial Predistorter Based on the Indirect Learning Architecture,"* Globecom 2002-IEEE Global Telecommunications Conference No. 1, Nov. 2002 pp. 976-980.

International Search Report dated Jan. 23, 2007.

* cited by examiner

NON-LINEAR DISTORTION DETECTION METHOD AND DISTORTION COMPENSATION AMPLIFYING DEVICE

This is a Continuation of PCT/JP06/320642 filed Oct. 17, 2006 and published in Japanese.

BACKGROUND OF THE INVENTION

1. Field of the Invention

The present invention relates to a non-linear distortion detection method which detects a non-linear distortion in the power amplifier of a radio communication transmitter, and a distortion compensation amplifying device which compensates the non-linear distortion, and more particularly to a non-linear distortion detection method and a distortion compensation amplifying device in which, even if the band of a modulation signal is widened, a sampling frequency need not be heightened, and distortion detection can be performed without increasing a circuit size and dissipation power.

2. Description of the Related Art

Consideration for an environment, the decrease of consumption power, the decreases of a size and a weight, etc. have been required of a power amplifier in a transmission apparatus, and in order to meet these requirements, it has become necessary to attain a higher efficiency by decreasing thermal radiation. In general, in order to heighten the efficiency of the power amplifier, the peak power of a modulation signal is designed so as to become the saturation power of the power amplifier. However, the intermodulation distortions of a transmission signal appear on account of the non-linearity of the power amplifier, and they interfere with another radio equipment.

The intermodulation distortions ascribable to the power amplifier will be explained. FIG. 7 is an explanatory diagram showing the output spectrum of the power amplifier having a non-linear characteristic (W-CDMA, two carriers (detuning frequency: 5 MHz)).

As shown in FIG. 7, when a modulation signal is inputted, the spectrum spreads due to a non-linear distortion, and the intermodulation distortions (IM3, IM5) appear. As also seen from the figure, the intermodulation distortions appear at the same frequency intervals as the detuning frequency of the modulation signal. A distortion compensation has been extensively performed in order to improve the intermodulation distortions.

Here, predistortion being one of distortion compensation systems will be explained.

The predistortion is a method wherein the reverse characteristic of the power amplifier is provided at a preceding stage, thereby to decrease the intermodulation distortions, and the reverse characteristic is adaptively controlled in accordance with a temperature change and an individual difference.

A prior-art distortion detection method employed in the adaptive control of the predistortion will be described with reference to FIG. 8. FIG. 8 is a block diagram of a power amplifying device which employs the prior-art distortion detection method.

As shown in FIG. 8, the prior-art power amplifier is configured of a predistorter 1, a D/A converter 2, an orthogonal modulator 3, an oscillator 4, a power amplifier 5, a directivity coupler 6, a mixer 7, an oscillator 8, an A/D converter 9, a distortion detection unit 12 and a control unit 13. The distortion detection unit 12 is further configured of an FFT calculation portion (in the figure, FFT) 10 and an IM calculation portion 11.

The predistorter 1 performs a distortion compensation which bestows the reverse characteristic of the non-linear distortion on an input signal, in compliance with a command from the control unit 13.

The D/A converter 2 converts the distortion-compensated digital input signal into an analog signal.

The oscillator 4 oscillates an RF frequency.

The orthogonal modulator 3 subjects the inputted analog signal to orthogonal modulation, thereby to up-convert the signal at the frequency of the oscillator 4.

The power amplifier 5 amplifies the inputted RF signal at a predetermined amplification factor, and outputs the amplified signal.

The directivity coupler 6 branches the output signal from the power amplifier 5, so as to feedback the branched signal.

The mixer 7 synthesizes a signal from the oscillator 8 and the signal branched from the directivity coupler 6, thereby to down-convert the synthesized signal into an IF frequency.

The A/D converter 9 A/D-converts the down-converted signal with a clock-2 (CLK2), so as to sample the resulting signal.

The distortion detection unit 12 detects a distortion contained in the inputted sampling signal, and outputs the detected distortion as a distortion value to the control unit 13.

The FFT calculation portion 10 of the distortion detection unit 12 obtains a spectrum by subjecting the inputted signal to an FFT (Fast Fourier Transform).

The IM calculation portion 11 calculates the frequencies of intermodulation distortions from the number of carriers of a modulation signal and the detuning frequency thereof, and it outputs power values at the frequencies, to the control unit 13 as distortion values on the basis of the spectrum.

In addition, the control unit 13 adaptively controls the predistorter so that the inputted distortion values may become smaller.

Operations in the power amplifier of the above configuration will be described.

The input signal of the IF frequency inputted in a digital I/Q form is endowed with the reverse characteristic of the non-linear distortion of the power amplifier by the predistorter 1, it is converted into the analog signal by the D/A converter 2, and the analog signal is subjected to the orthogonal modulation and is up-converted into the RF frequency by the orthogonal modulator 3, and the resulting signal is amplified at the predetermined amplification factor and is outputted by the power amplifier 5.

On the other hand, part of the output of the power amplifier 5 is derived by the directivity coupler 6 and is down-converted into the IF frequency by the mixer 7, the IF frequency is converted into the digital signal by the A/D converter 9, the digital signal is subjected to the spectrum detection by the FFT calculation portion 10 of the distortion detection unit 12, and the power values at the intermodulation distortions (IM3, IM5) are calculated by the IM calculation portion 11 and are outputted to the control unit 13 as the distortion values.

In addition, the control unit 13 adaptively controls the predistorter so as to make the distortion values smaller.

It is at odd-ordered distortions that the non-linear characteristic of the power amplifier appears as the intermodulation distortions. Therefore, processing in the predistorter which bestows the non-linear reverse characteristic of the power amplifier can be approximated by Formula (1):

$$y = x + \alpha \cdot |x|^2 \cdot x + \beta |x|^4 \cdot x + \gamma \cdot |x|^6 \cdot x \qquad \text{Formula (1)}$$

Here, x and y denote the input signal and output signal of the predistorter, respectively, and the signals are complex numbers. The control unit 13 controls the values of α, β and γ by the use of a perturbation method so that the distortion values obtained by the distortion detection unit 12 may become smaller.

Here, the schematic configuration of the predistorter 1 will be described with reference to FIG. 9. FIG. 9 is a block diagram showing the schematic configuration of the predistorter 1.

As shown in FIG. 9, the predistorter 1 includes a plurality of multipliers and an adder, and it is configured so as to calculate the components of the third power, fifth power and seventh power from the input signal (x), to multiply the respective components by the coefficients α, β and γ and to obtain the output signal (y) on the basis of Formula (1).

α, β and γ are complex numbers, and they are respectively represented as:

$$\alpha = A3 \cdot \exp(j*\Phi 3)$$

$$\beta = A5 \cdot \exp(j*\Phi 5)$$

$$\gamma = A7 \cdot \exp(j*\Phi 7) \qquad \text{Formulas (2)}$$

In the control unit 13, therefore, these coefficients are cyclically controlled by the perturbation method in the sequence of $\Phi 3 \rightarrow A3 \rightarrow \Phi 5 \rightarrow A5\ \Phi 7 \rightarrow A7 \rightarrow \Phi 3$.

The control employing the perturbation method, in the control unit 13 will be described with reference to FIG. 10. FIG. 10 is a flow chart diagram showing the control employing the perturbation method, in the control unit 13.

As shown in FIG. 10, when a process is started, the control unit 13 first sets the coefficient to-be-updated (K, and here, the first coefficient is Φ3) and fetches the number of times of setting and the last distortion value as initialization (100).

In addition, when the current distortion value calculated in the distortion compensation unit 12 is inputted, the control unit 13 compares the magnitudes of the current distortion value and the last distortion value (101). If the current distortion value has become smaller (in case of "Yes"), the coefficient is further updated in the same direction (K=K+Step) (103).

Besides, if the distortion value has become larger at the processing 101 (in case of "No"), the control unit 13 inverts an updating direction (Step=Step*(−1)) (102), and it shifts to the processing 103 so as to update the coefficient.

Subsequently, the control unit 13 counts how many times the same coefficient (here, Φ3) was successively updated (104), and it retains the distortion value detected as the "current distortion value" at the processing 101 (105). The distortion value retained here is used as the "last distortion value" at the processing 101 of the next time.

In addition, the control unit 13 compares the stored number of times of updating and the number of times of setting as has been set at the initialization of the processing 100 (106) If the number of times of updating is equal to or less than the number of times of setting, the control unit 13 returns to the processing 101 and repeats the updating of the coefficient Φ3.

Besides, in a case where the number of times of updating exceeds the number of times of setting at the processing 106, the control unit 13 alters the coefficient to-be-updated (107). Here, the coefficient to-be-updated is altered from Φ3 to A3. In addition, the control unit 13 clears the stored number of times of updating (108).

In the control unit 13, the coefficients of the predistorter are controlled so as to make the distortion value smaller, by the control employing such a perturbation method. In this way, the non-linear reverse characteristic in the power amplifier can be approximated by the predistorter employing the power series, and the distortion compensation is permitted.

Incidentally, as a prior-art technique of a transmission apparatus which performs the distortion compensation, there is JP-A-2005-20515 laid open on Jan. 20, 2005, "ADAPTIVE PREDISTORTER TYPE DISTORTION-COMPENSATED TRANSMISSION APPARATUS AND METHOD FOR SWITCHING DELAY CONTROL FILTER COEFFICIENTS THEREFOR" (Applicant: Fujitsu Ltd., Inventor: Mitsuharu Hamano).

This prior-art technique is a method wherein, in switching the filter coefficients of a delay control filter which adjusts the phases of a transmission signal and a feedback signal in an adaptive predistorter type distortion-compensated transmission apparatus, the filter coefficient to be set anew is read out from a memory in which the filter coefficients are stored beforehand, and it is distributed to a filter coefficient setting register via a test loop path which is branched from a main signal loop path for conveying the transmission signal and which is folded back, whereby the switching of the filter coefficients can be performed at a high speed (refer to Patent Document 1).

Besides, as another prior-art technique, there is JP-A-2005-102029 laid open on Apr. 14, 2005, "ADAPTIVE TYPE PREDISTORTER" (Applicant: Mitsubishi Electric Corporation, Inventor: Ken-ichi Horiguchi).

This prior-art technique updates a compensation coefficient in a distortion compensation circuit and attains a stable convergence characteristic irrespective of the amplitude level of an input signal, etc., in conformity with a normalized least square mean algorithm wherein a comparator detects the error between an output signal from a distortion compensation circuit and an input signal to the distortion compensation circuit, and wherein a normalized least square mean circuit minimizes the square mean of error signals by normalizing the square mean with the variance of the input signal (refer to Patent Document 2).

Further, as another prior-art technique, there is JP-A-2005-73032 laid open on Mar. 17, 2005, "DISTORTION COMPENSATION AMPLIFYING DEVICE AND DISTORTION COMPENSATION METHOD" (Applicant: Hitachi Kokusai Electric Inc., Inventor: Naoki Hongo).

This prior-art technique is such that a control unit performs the curve interpolations of a plurality of points which are stored by distortion compensation table means for storing predistortion magnitudes corresponding to electric power values, in a plurality of intervals which overlap partly, and that the control unit joins individual curves obtained by the curve interpolations, thereby to update the points which are stored by the distortion compensation table means, and to compensate a distortion characteristic which contains an inflection point (refer to Patent Document 3).

Besides, as a technique which controls a predistorter on the basis of the equalization error of an equalizer, there is US20050163249A1 (refer to Patent Document 4). Besides, as a technique which includes an equalizer for extracting a distortion, and an equalizer for compensating the distortion, there is "Lei Ding et al, Memory Polynomial Predistorter Based on the Indirect Learning Architecture, GLOBECOM 2002-IEEE Global Telecommunications Conference, no. 1, Nov. 2002 pp. 976-980" (refer to Non-patent Document 1). In addition, as techniques concerning the distortion compensation, there are US20050163250A1, US20050099230A1 and US20050089125A1 (refer to Patent Documents 5, 6 and 7).

Patent Document 1: JP-A-2005-20515 (pp. 4-8)
Patent Document 2: JP-A-2005-102029
Patent Document 3: JP-A-2005-73032
Patent Document 4: US20050163249A1

Non-patent Document 1: Lei Ding et al, Memory Polynomial Predistorter Based on the Indirect Learning Architecture, GLOBECOM 2002-IEEE Global Telecommunications Conference, no. 1, Nov. 2002 pp. 976-980

Patent Document 5: US20050163250A1
Patent Document 6: US20050099230A1
Patent Document 7: US20050089125A1

With the prior-art power amplifying device, however, the signal of the output of the power amplification portion is subjected to the frequency conversion by the FFT, and the electric powers of the intermodulation distortions are calculatively obtained, thereby to detect the distortion. It is therefore necessary to perform the sampling and the signal processing as to a frequency range which covers the bands of the intermodulation distortions.

A case where signal processing of wide band is required, will be explained with reference to FIG. 11. FIG. 11 is an explanatory diagram showing another output spectrum of a power amplifier having a non-linear characteristic (W-CDMA, two carriers (detuning frequency: 15 MHz)).

As shown in FIG. 11, the intermodulation distortions (IM3, IM5) appear at the same frequency intervals as the detuning frequency of the two carriers. Therefore, when the detuning frequency becomes large, signals of wider bands must be processed in the distortion detection unit in order to calculate the electric power values by detecting the spectra of the distortions IM3 and IM5.

In the future, a request for high-speed transfer will inevitably rise, and it is expected that the frequency band of a modulation signal will widen more and more.

Further, as the band of the signal widens more, the sampling frequency needs to be raised in the A/D converter (A/D converter 9 in FIG. 8) for detecting the distortion, and a calculation amount in the FFT calculation portion of the distortion compensation unit enlarges, to incur such problems as the increase of a circuit size, the rise of a cost and the increase of consumption power.

Besides, in a case where, as in Patent Document 1, a transmission signal and a feedback signal are compared in a temporal region so as to detect an error, it has been difficult to bring a phase, an amplitude and a delay time exactly into agreement.

SUMMARY OF THE INVENTION

The present invention has been made in view of the above circumstances, and has for its object to provide a non-linear distortion detection method and a distortion compensation amplifying device in which, even when the band of a modulation signal is widened, a sampling frequency need not be heightened, and distortion detection can be performed without increasing a circuit size or consumption power.

The present invention for solving the problems of the prior-art examples consists in a non-linear distortion detection method in a distortion compensation amplifying device including an amplifier which subjects an input signal to power amplification; distortion compensation means for compensating non-linear distortions which appear in the amplifier, as to an inputted modulation signal to be amplified; a distortion detection unit which detects distortion components contained in an output of the amplifier and estimates the distortions, on the basis of a feedback signal of the amplifier output; and a control unit which controls the distortion compensation means on the basis of the estimation of the distortions in the distortion detection unit; characterized in that the distortion detection unit equalizes the feedback signal of the amplifier output with a reference symbol being an input signal to the distortion compensation means, that it calculates an equalization error between the equalized signal and the reference symbol, and that it estimates the distortions on the basis of the equalization error, so that sampling need not be performed over a wide band, and the distortions can be detected without increasing a sampling frequency and a calculation amount, to bring forth the advantage that, even when the band of a modulation signal is widened, the increase of a circuit size or consumption power can be suppressed.

Besides, the invention consists in the non-linear distortion detection method characterized in that the distortion detection unit calculates a temporal average value obtained by temporally averaging absolute values of the equalization error over a specified time period, and that it estimates the distortions on the basis of the temporal average value.

Besides, the invention consists in the non-linear distortion detection method characterized in that the distortion detection unit changes an amplitude of the input signal to the distortion compensation means, cyclically from a low level to a high level, that it detects equalization errors at the respective levels of the amplitude of the input signal and averages the detected equalization errors, and that it estimates distortions at the respective amplitude levels on the basis of results of the averaging, so that the distortions are detected as vectors, to bring forth the advantage that convergence can be made fast by employing a distortion compensation algorithm which is faster than a perturbation method.

Besides, the invention consists in a distortion compensation amplifying device including a power amplifier which subjects an input signal to power amplification; a predistorter which compensates non-linear distortions that appear in the power amplifier, as to an inputted modulation signal to be transmitted; an A/D converter which samples a feedback signal of an output of the power amplifier at a specified frequency; a distortion detection unit which detects distortion components contained in the power amplifier output, on the basis of the A/D-converted feedback signal, and which outputs the distortion components as distortion values; and a control unit which controls the predistorter on the basis of the distortion values; characterized in that the A/D converter is an A/D converter which samples the feedback signal at a frequency capable of sampling a frequency band that contains the modulation signal to be transmitted and that does not contain intermodulation distortions; and that the distortion detection unit is a distortion detection unit which includes an equalizer that receives an input signal to the predistorter, as a reference symbol, that equalizes the feedback signal of the power amplifier output by a FIR filter and that outputs an equalization error between the equalized signal and the reference symbol, and an absolute-value averaging portion that outputs as the distortion value, a temporal average value obtained by temporally averaging absolute values of the equalization error over a specified time period, so that a sampling frequency need not be heightened by narrowing the sampling frequency, and the distortions can be detected without increasing a calculation amount, to bring forth the advantage that, even when the band of the modulation signal is widened, the increase of a circuit size or consumption power can be suppressed.

Besides, the invention consists in a distortion compensation amplifying device including a power amplifier which subjects an input signal to power amplification; a predistorter which compensates non-linear distortions that appear in the power amplifier, as to an inputted modulation signal to be transmitted; an A/D converter which samples a feedback signal of an output of the power amplifier at a specified frequency; a distortion detection unit which detects distortion components contained in the power amplifier output, on the basis of the A/D-converted feedback signal, and which outputs the distortion components as distortion values; and a control unit which controls the predistorter on the basis of the distortion values; characterized in that the distortion detection unit is a distortion detection unit which includes a plurality of averaging portions that average an output from an equalizer, at respective levels of an amplitude of a reference symbol, and that output the average values as the distortion values corresponding to the levels of the amplitude of the reference symbol; and the equalizer that receives an input signal to the predistorter, as the reference symbol, that equalizes the feedback signal of the power amplifier output by a FIR filter, that calculates an equalization error between the equalized signal and the reference symbol, that divides a calculated result of a complex conjugate calculation between the equalization error and the reference symbol, by a square of an amplitude component of the reference symbol and decides the level of the amplitude of the reference symbol on the basis of the square of the amplitude component of the reference symbol, and that outputs a result of the division to the averaging portion corresponding to the decided level of the amplitude, so that the distortions are detected as vectors, to bring forth the advantage that convergence can be made fast by using a distortion compensation algorithm which is faster than a perturbation method.

Besides, the invention consists in the distortion compensation amplifying device characterized in that the distortion detection unit is a distortion detection unit which includes an LMS portion that updates a tap coefficient of the FIR filter in conformity with an LMS algorithm.

Besides, the invention consists in the distortion compensation amplifying device characterized in that the LMS portion is an LMS portion which updates the tap coefficient with reference to the reference symbol every plurality of sample time periods.

Besides, the invention consists in a distortion compensation amplifying device including a power amplifier which subjects an input signal to power amplification; a predistorter which compensates non-linear distortions that appear in the power amplifier, as to an inputted modulation signal to be transmitted; an A/D converter which samples a feedback signal of an output of the power amplifier at a specified frequency; a distortion detection unit which detects distortion components contained in the power amplifier output, on the basis of the A/D-converted feedback signal, and which outputs the distortion components as distortion values; and a control unit which controls the predistorter on the basis of the distortion values; characterized in that the distortion detection unit is a distortion detection unit which includes an equalizer that receives the input signal to the predistorter, as a reference symbol, that equalizes the feedback signal of the power amplifier output by a FIR filter, and that outputs an equalization error between the equalized signal and the reference symbol, as the distortion value so that an FFT in distortion detection is dispensed with, to bring forth the advantages that a processing amount is decreased and that a distortion compensation of high precision can be made.

Besides, the invention consists in the distortion compensation amplifying device characterized in that the predistorter is a predistorter which includes a third-order intermodulation distortion generator, a fifth-order intermodulation distortion generator, a seventh-order intermodulation distortion generator, a first FIR filter corresponding to the third-order intermodulation distortion generator, a second FIR filter corresponding to the fifth-order intermodulation distortion generator, and a third FIR filter corresponding to the seventh-order intermodulation distortion generator; and that the control unit is a control unit which updates tap coefficients of the first, second and third FIR filters of the predistorter on the basis of the distortion values outputted from the distortion detection unit so that there is the advantage that a distortion compensation of high precision can be made in the predistorter.

Besides, the invention consists in the distortion compensation amplifying device characterized in that first, second and third step gains which determine response rates for updating the tap coefficients of the first, second and third FIR filters, respectively, are set so as to become the first step gain>the second step gain>the third step gain so that the coefficients in the FIR filters can be converged in the order of a third-order distortion, a fifth-order distortion and a seventh-order distortion, to bring forth the advantage that the stability of the convergence can be enhanced.

BRIEF DESCRIPTION OF THE DRAWINGS

FIG. 20 shows AM-PM conversion characteristics in the cases where the gate voltage Vg which is fed to the peak amplifier is changed.

DESCRIPTION OF REFERENCE NUMERALS

Figure 1:
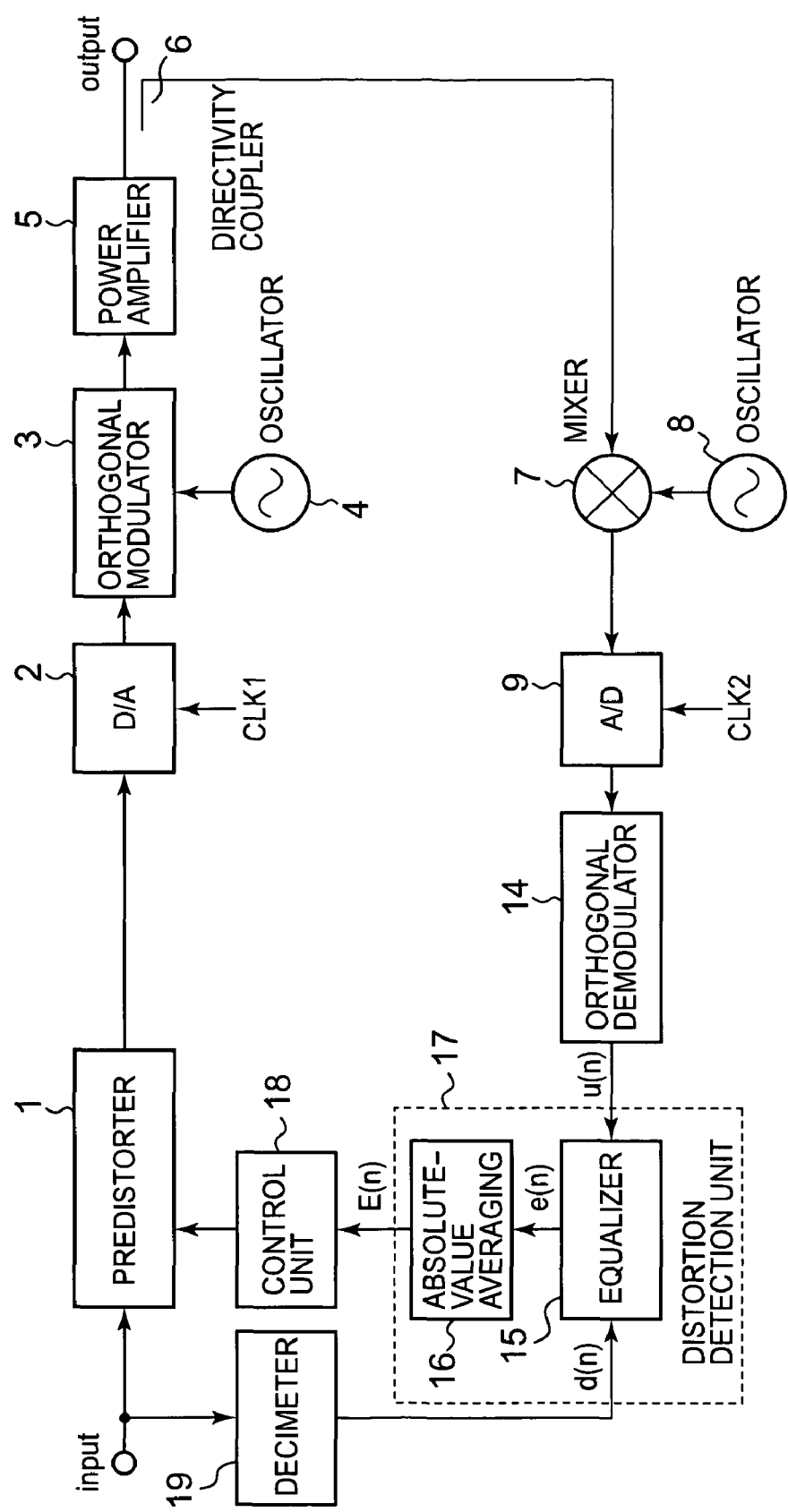
FIG. 1 is a configurational block diagram of a distortion compensation amplifying device (first amplifying device) which employs a distortion detection method according to the first embodiment of the present invention.

1 . . . Predistorter, 2 . . . D/A converter, 3 . . . Orthogonal modulator, 4 . . . Oscillator, 5 . . . Power amplifier, 6 . . . Directivity coupler, 7 . . . Mixer, 8 . . . Oscillator, 9 . . . A/D converter, 10 . . . FFT portion, 11 . . . IM calculation portion, 12 . . . Distortion detection unit, 13 . . . Control unit, 14 . . . Orthogonal modulator, 15 . . . Equalizer, 16 . . . Absolute-value averaging portion, 17 . . . Distortion detection unit, 18 Control unit, 20 . . . Doherty amplifier, 25 . . . LMS portion, 31, 33, 34 . . . Phase shifters, 40 . . . Carrier amplifying circuit, 41 . . . Input matching circuit, 42 . . . Amplifying element, 43 . . . Output matching circuit, 50 . . . Peak amplifying circuit, 51 . . . Input matching circuit, 52 . . . Amplifying element, 53 . . . Output matching circuit, 60 . . . Doherty synthesis portion, 61 . . . Transformer, 62 . . . Node (Synthesis point), 64, 65, 66, 67 . . . Impedance transformers, 70 . . . Transformer, 80 . . . Output terminal, 90 . . . Load, 100 . . . Predistorter, 101 . . . Third-order distortion generator, 102 . . . Fifth-order distortion generator, 103 . . . Seventh-order distortion generator, 104 . . . Delay circuit, 105 . . . First FIR filter, 106 . . . Second FIR filter, 107 . . . Third FIR filter, 108-110 Adders, 111 . . . Input terminal, 112 . . . Distributor, 113 . . . Phase shifter, 120 . . . CPU, 130 . . . I/O controller, 150 . . . Gate terminal, 161 . . . Complex multiplier, 162 . . . Squaring portion, 163 . . . Divider, 164 . . . Amplitude decision portion, 165 . . . Averaging portion, 200 . . . Predistortion distortion compensating circuit, 201 . . . Input terminal, 202 . . . Predistorter, 203 . . . D/A converter, 204 . . . Orthogonal modulator, 205 . . . Oscillator, 206 . . . Power amplifier, 207 . . . Output terminal, 208 . . . Directivity coupler, 209 . . . Mixer, 210 . . . Oscillator, 211 . . . A/D converter, 212 . . . Distortion detection unit, 213 . . . Fast Fourier transform circuit (FFT), 214 . . . IM calculation circuit, 216 . . . D/A converter, 217 . . . Control unit, 251 . . . Complex calculation portion, 252 . . . Multiplier, 253 . . . Adder, 254, 255 . . . Delay elements

DESCRIPTION OF THE PREFERRED
EMBODIMENT

Embodiments of the present invention will be described with reference to the drawings.

The non-linear distortion detection method of the invention is such that a signal obtained by feeding-back the output of a power amplification portion is subjected to A/D conversion and orthogonal demodulation, that the equalizer of a distortion detection unit detects the equalization error of the orthogonal demodulation signal with the input signal of a predistorter as a reference symbol, that the absolute-value averaging portion of the distortion detection unit outputs a value obtained by temporally averaging the absolute value of the equalization error, to a control unit as a distortion value for estimating a distortion, and that the control unit controls the predistorter on the basis of the distortion value. Since an FFT is not performed in the distortion detection unit, signal processing need not be executed over a wide band, and even when the band of signals is widened, the distortion can be detected without heightening a sampling frequency, and the increases of a circuit size and consumption power can be prevented.

Besides, the distortion compensation amplifying device of the invention is such that a distortion detection unit includes an equalizer which detects an equalization error with the input signal of a predistorter as a reference symbol, and an absolute-value averaging portion which calculates the temporal average of the absolute value of an equalizer output, that a signal obtained by branching the output of a power amplification portion is down-converted and subjected to orthogonal demodulation after A/D conversion, that the equalizer of the distortion detection unit detects the equalization error of the orthogonal demodulation signal with the input signal of the predistorter as the reference symbols, that the absolute-value averaging portion outputs a value obtained by temporally averaging the absolute value of the equalization error, to a control unit as a distortion value, and that the control unit controls the predistorter on the basis of the distortion value. Since an FFT is not performed in the distortion detection unit, signal processing need not be executed over a wide band, and a distortion can be detected without heightening a sampling frequency, and the increases of a circuit size and consumption power can be prevented.

FIG. 1 is a configurational block diagram of a distortion compensation amplifying device (first amplifying device) which employs a distortion detection method according to the first embodiment of the invention.

Figure 8:
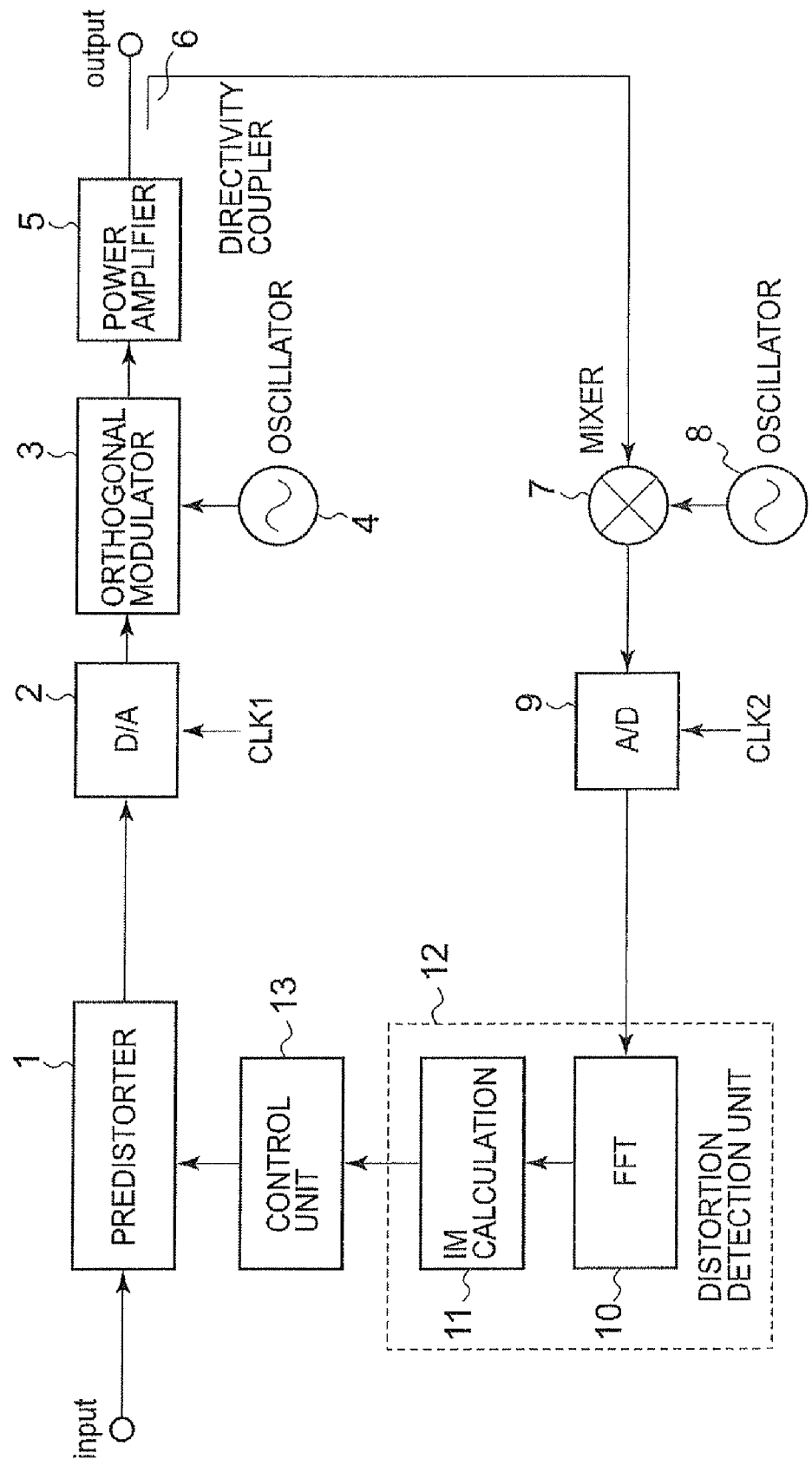
FIG. 8 is a block diagram of a power amplifying device which employs a prior-art distortion detection method.

As shown in FIG. 1, the first amplifying device includes a predistorter 1, a D/A converter 2, an orthogonal modulator 3, an oscillator 4, a power amplifier 5 and a directivity coupler 6 as the same parts as in the prior-art power amplifying device shown in FIG. 8, and it includes a mixer 7, an oscillator 8, an A/D converter 9, an orthogonal demodulator 14, a distortion detection unit 17, a control unit 18 and a decimeter 19 as the featuring parts of the first power amplifier. Further, the distortion detection unit 17 is configured of an equalizer 15 and an absolute-value averaging portion (in the figure, absolute-value averaging) 16.

Since the same parts as in the prior-art power amplifying device are the same as in the prior art in configurations and operations, they shall be omitted from description here.

The featuring parts of the first amplifying device will be concretely described.

The mixer 7 down-converts the output signal of the power amplifier 5 branched by the directivity coupler 6, into an IF frequency by synthesizing this output signal with a signal from the oscillator 8. Besides, the IF frequency and its bandwidth may well be the same as the IF frequency of an input signal to the predistorter 1. That is, the oscillator 8 may be the same as the oscillator 4, and it may well be shared. Incidentally, it is also allowed to replace the mixer 7 with an analog orthogonal demodulator, to perform direct demodulation by affording the same local signal as that of the orthogonal modulator 3, and to sample signals by two A/D converters and input the signals to the distortion detection unit.

The A/D converter 9 samples the down-converted signal at a clock-2, and subjects the sampled signal to A/D conversion. Here, as the feature of the first power amplifier, an FFT is not employed for distortion conversion, so that a wide band which contains even intermodulation distortions IM3 and IM5 need not be sampled. Accordingly, the clock-2 may be at a frequency at which only the frequency band of the original modulation signal can be normally sampled.

In case of, for example, an amplifying device which handles the four carriers of a WCDMA signal, a clock-1 (sample rate of the D/A converter 2) is at 122.88 MHz corresponding to 32 times a chip rate, whereas the clock-2 can be made several tenths (for example, one-third).

Accordingly, the clock frequency need not be heightened, and a cost and consumption power need not be increased. Thus, the modulation signal and the intermodulation distortions which are contained in the down-converted signal are dropped into the band of Nyquist frequencies.

Besides, the orthogonal demodulator 14 subjects the A/D-converted sampling signal to orthogonal demodulation. Besides, the decimeter 19 down-samples the input signal d(n) to the predistorter 1, down to the sampling rate of the orthogonal demodulation signal from the orthogonal demodulator 14, thereby to output the signal d(n).

The distortion detection unit 17 is the featuring part of the first amplifying device, it is configured of the equalizer 15 and the absolute-value averaging portion 16, and it detects distortions contained in the sampling signal subjected to the orthogonal demodulation and outputs them to the control unit 18 as a distortion value.

The equalizer 15 of the distortion detection unit 17 receives the orthogonal demodulation signal u(n) from the orthogonal demodulator 14, and the input signal d(n) to the predistorter 1, as a reference signal, and it detects an equalization error e(n) and outputs this error to the absolute-value averaging portion 16.

Figure 2:
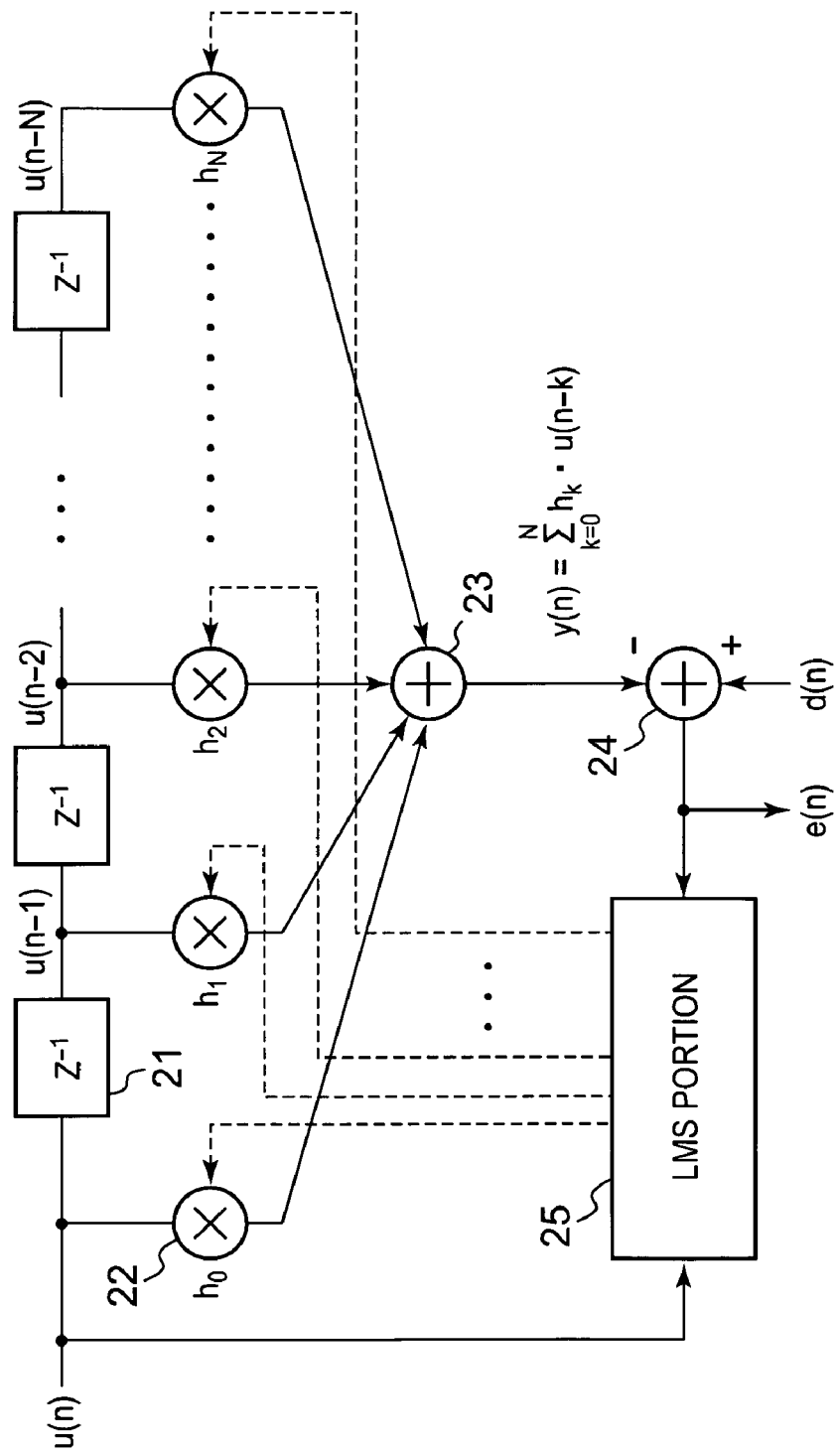
FIG. 2 is an explanatory diagram showing the schematic configuration of an equalizer 15.

Here, the configuration of the equalizer 15 will be described with reference to FIG. 2. FIG. 2 is an explanatory diagram showing the schematic configuration of the equalizer 15.

The equalizer 15 includes an FIR (Finite Impulse Response) filter, an adder 24 which outputs the difference between the output of the FIR filter and the reference signal, as the equalization error, and an LMS portion 25 in which an adaptation algorithm is installed.

The FIR filter is configured of delay elements 21 each of which delays an input signal one sample time period, multipliers 22 each of which executes a multiplication by a set coefficient, an adder 23 which adds up outputs from the respective multipliers, and the adder 24 which outputs the difference between the output of the adder 23 and the reference signal, as the equalization error.

The LMS portion 25 evaluates optimal tap coefficients minimizing the equalization error e(n), in conformity with the LMS algorithm indicated in [Formulas 1], every sample time period of the orthogonal demodulation signal (corresponding to the clock-2), so as to update the coefficients of the respective multipliers.

$$h(n+1) = h(n) + \mu \cdot u(n) e(n)$$

$$e(n) = d(n) - u(n)^T h(n) \quad \text{[Formulas 1]}$$

Here, n denotes the index of a sample, u(n) the input signal, h(n) the tap coefficient, d(n) the reference symbol, and e(n) the equalization error, and μ is a step gain.

Further, h(n) and u(n) are concretely denoted as indicated in [Formulas 2].

$$h(n) = [h_0 h_1 \ldots h_N]^T$$

$$u(n) = [u(n) u(n-1) \ldots u(n-N)]^T \quad \text{[Formulas 2]}$$

In the equalizer 15, u(n) is the orthogonal demodulation signal, while d(n) is the input signal of the predistorter, and both are complex signals.

Figure 3:
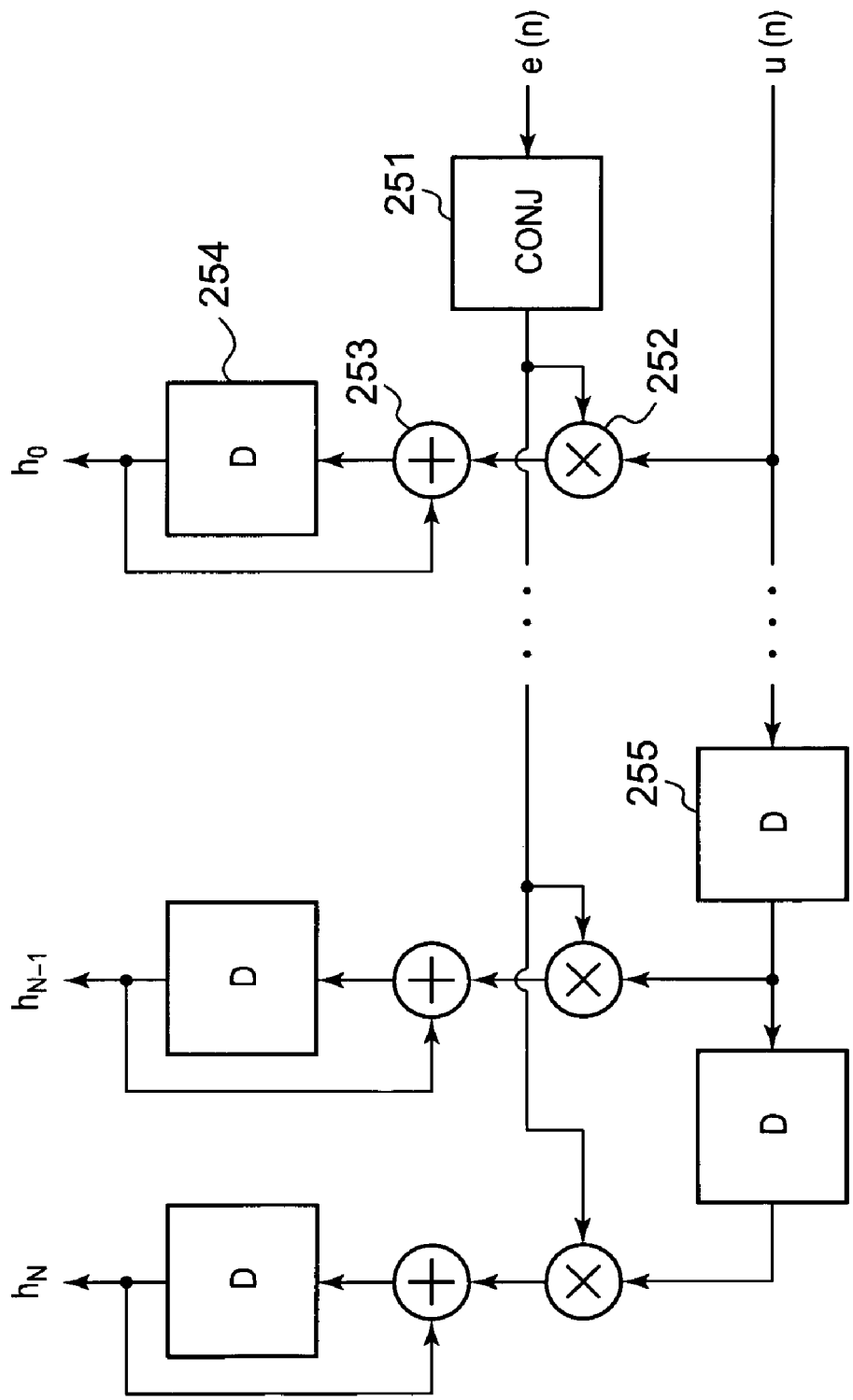
FIG. 3 is a configurational block diagram of an LMS portion 25.

Here, the configuration of the LMS portion 25 will be described with reference to FIG. 3. FIG. 3 is a configurational block diagram showing the configuration of the LMS portion 25 of the equalizer 15.

As shown in FIG. 3, the LMS portion 25 is configured of a complex conjugate calculation portion 251, multipliers 252, adders 253, delayers 254 and delayers 255.

In addition, the complex conjugate calculation of the equalization error e(n) is executed by the complex conjugate calculation portion 251, the result of the complex conjugate calculation and the input signal u(n) are multiplied by the multipliers 252, and the results of the multiplications are added to the last tap coefficients h(n) by the adders 253, so as to calculate new tap coefficients h(n) and to output them to the respective multipliers 22 of the FIR filter.

Besides, the absolute-value averaging portion 16 evaluates the absolute value of the equalization error e(n) outputted from the equalizer 15, and it outputs a value obtained by adding the absolute values over a specified time period (temporally averaged value), to the control unit 18 as a distortion value. Assuming that intervals for taking the temporal average are M samples, the distortion value E(n) which is outputted from the absolute-value averaging portion 16 is represented by [Formula 3].

$$E(n) = \sum_{i=n-M+1}^{n} |e(i)| \quad \text{[Formula 3]}$$

That is, in the first amplifying device, the quantity E(n) is outputted as the distortion value from the distortion detection unit 17 and is given to the control unit 18, and the coefficient of the predistorter is set so that the distortion value may become smaller by the perturbation method stated before, in the control unit 18.

The roles of the equalizer 15 of the distortion detection unit 17 also comprehend to correct the discrepancy of timings as occurs due to a delay ascribable to a filter or microstrip line of high frequency, and to establish synchronization for the purpose of comparing the waveforms of the input signal of the predistorter 1 and the output signal of the power amplification portion in basebands, following up a phase rotation which is caused by a frequency offset ascribable to the difference of the local frequencies of the orthogonal modulator and the mixer.

In a case where the synchronization has been established by the equalizer, the equalization error e(n) becomes almost zero under the tentative assumption that the power amplifier does not have any non-linear distortion.

Figure 4:
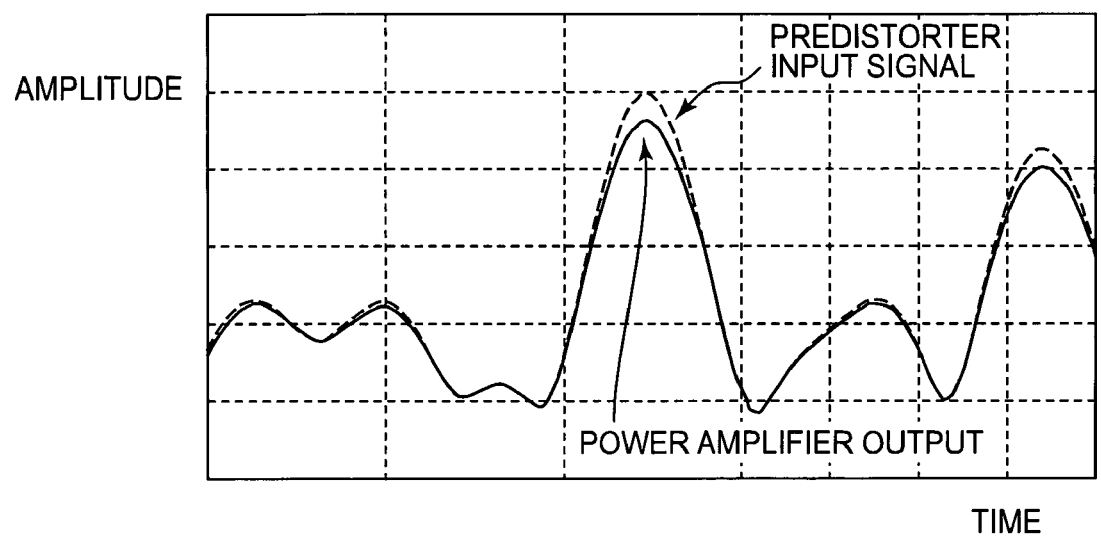
FIG. 4 is an explanatory diagram showing waveforms in which the input signal of a predistorter 1 and the envelope of a power amplification portion are temporally compared.

Since, however, the actual power amplifier has the non-linear distortion, the component of the non-linear distortion appears as the equalization error with the FIR filter which can equalize only a linear distortion. The equalization error which is detected will be explained with reference to FIG. 4. FIG. 4 is an explanatory diagram showing waveforms obtained by temporally comparing the input signal of the predistorter 1 and the envelope of the power amplification portion whose non-linear distortion is not compensated. By the way, in FIG. 4, the output signal of the power amplifier is corrected so that a gain may become one.

As shown in FIG. 4, in the state where the synchronization has been established, the distortion component of the non-linear distortion becomes larger as the input level to the power amplifier 5 is larger. Therefore, when the input signal has a comparatively small level, the equalization error does not appear, and when a value near peak power is inputted, the equalization error enlarges. Accordingly, after the absolute values of the equalization error have been calculated, they are averaged for a time period (for example, 1-10 ms) long enough to neglect the influence of a power fluctuation, whereby the average value can be used as the distortion value.

In the first amplifying device, the control unit 18 updates the coefficient of the predistorter and performs the adaptive control as in the prior art, on the basis of the distortion value thus obtained.

By the way, in the first amplifying device, the sampling frequency CLK-2 of the A/D converter 9 is set at a frequency capable of sampling only the frequency bandwidth of the modulation signal, and hence, the intermodulation distortions outside the band of the modulation signal drop into the band of the modulation signal by aliasing.

In the first amplifying device, by utilizing this fact, the components of the intermodulation distortions having dropped into the band of the modulation signal are made detectable by the sampling in only the band of the modulation signal, in such a way that the absolute values of the equalization error are averaged for the sufficiently long time period.

The equalizer 15 according to the first embodiment of the invention is for the purpose of estimating the distortion value from the equalization error. Therefore, the equalizer 15 may be such that, as the non-linear distortion appearing in the power amplifier or the like becomes smaller, the difference between the input signal d(n) of the predistorter serving as the reference signal and the orthogonal modulation signal u (n) to be equalized becomes smaller, and more desirably, that the difference becomes zero in the nonexistence of the non-linear distortion. Accordingly, frequency characteristics which the reference signal and the orthogonal demodulation signal undergo should preferably be brought into agreement to the utmost.

Besides, the sampling rate of the orthogonal demodulation signal can also be made smaller than double the bandwidth of the modulation signal (20 MHz in the example of the embodiment), but it should preferably be about double or larger to the utmost.

Besides, the power amplifier 5 and the predistorter 1 are usually configured by separate substrates and adjusted later. According to the first amplifying device, however, the uncertainties of the frequency characteristics of the connected portions can be absorbed by the equalizer 15, and the number of man-hour of the adjustments decreases to bring forth the advantage that a manufacturing cost can be lowered.

Incidentally, the first amplifying device has been described on the example in which the LMS algorithm is applied as the algorithm employed in the equalizer 15, but another algorithm may well be employed as long as it can establish the synchronism.

Besides, the principle has been indicated in the foregoing example. Since the ordinary CDMA signal is used as it is, as the reference signal in the first amplifying device, the amplitude thereof is not constant, and actually, a normalized LMS method in which the first formula of [Formulas 1] is set as $h(n+1)=h(n)+\mu \cdot u(n)/|u(n)|^2$ in the same manner as in Patent Document 2 should better be applied. Besides, since the frequency characteristics and delays to be equalized fluctuate hardly, the CDMA signal need not be continually referred to, and the LMS portion 25 may well update the coefficients by referring to the reference signal at intervals of a plurality of sample time periods (every plural sample time). The updating may well be executed by batch processing, not in real time.

Alternatively, when only signals of specified amplitude in the CDMA signal are subjected to adaptive equalization as reference signals, a distortion becomes an equalization error with reference to the specified amplitude and can be detected.

Next, a second distortion compensation amplifying device (second amplifying device) according to the second embodiment of the invention will be described.

In the first amplifying device stated above, the sampling of the narrow band containing only the modulation signal has been performed without heightening the sampling frequency, the temporal average for the sufficient long time period has been calculated as to the absolute values of the equalization error detected by the equalizer, and the average has been used for the control of the predistorter as the distortion value. In contrast, in the second amplifying device, a sampling band of sufficient wide range as contains the intermodulation distortion IM5 is maintained, and the equalization error is not detected in terms of only its magnitude, but it is detected as an error spectrum, whereby the control of the predistorter is performed on the basis of the error spectrum.

Figure 5:
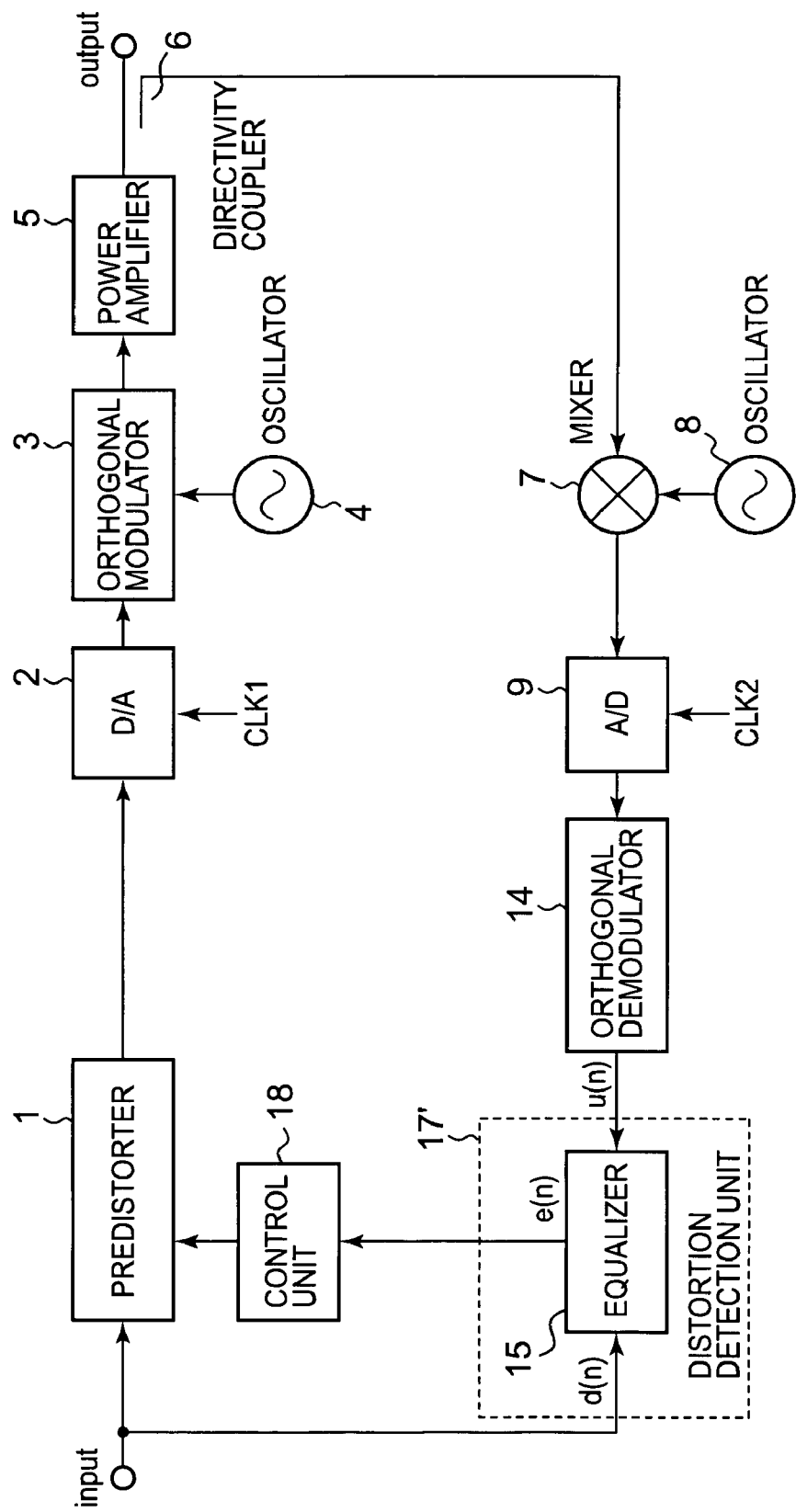
FIG. 5 is an explanatory diagram showing the configuration of the second amplifying device of the invention.

The second amplifying device will be described with reference to FIG. 5. FIG. 5 is an explanatory diagram showing the configuration of the second amplifying device.

As shown in FIG. 5, the second amplifying device has substantially the same configuration as that of the first amplifying device shown in FIG. 1, but the configurations and operations of a distortion detection unit 17, a control unit 18 and a predistorter 1 are partly different from those of the first amplifying device. Also, a sampling frequency in an A/D converter 9 differs from that of the first amplifying device. The other configurational parts are basically the same as in the first amplifying device, and they shall therefore be omitted from description.

The A/D converter 9 samples a branched and down-converted signal at a clock CLK-2, and outputs the signal to an orthogonal demodulator. Here, the sampling frequency of the A/D converter 9 is a frequency capable of sampling the signal to the extent of an intermodulation distortion IM5, and it is the same as the sampling frequency of a D/A converter 2 in this embodiment.

Besides, the predistorter 1 is provided with a lookup table in which, for example, phase shift magnitudes and attenuation magnitudes corresponding to the power values of an input signal are stored. It executes a multiplication by a distortion compensation value corresponding to the power value of the input signal, with reference to the lookup table, and it previously gives a transmission signal a distortion for compensating the non-linear distortion of a power amplifier.

The control unit 18 directly updates that specified value of the lookup table of the predistorter 1 which was used at the occurrence of an equalization error e(n), so as to minimize the equalization error in conformity with an LMS method, on the basis of the equalization error e(n) inputted from the equalizer 15 of the distortion detection unit 17. A concrete control method may be the same as in Patent Document 1.

The distortion detection unit 17 which is the featuring part of the second amplifying device is configured of the same equalizer 15 as in the first amplifier, and it is not provided with the absolute-value averaging portion 16 disposed in the first power amplifier.

The equalizer 15 receives a signal u(n) obtained by down-converting, sampling and orthogonal-demodulating the input signal branched from the output of the power amplifier, and the input signal d(n) of the predistorter as is a reference symbol, and it delivers the detected equalization error e(n) to the control unit 18. The configuration and operation of the equalizer 15 are the same as in the first amplifying device.

That is, in the second amplifying device, the equalization error is detected by the equalizer without employing an FFT for the distortion detection itself, and it is outputted to the control unit 18 as a distortion value as it is a vector. The second amplifying device samples a sufficiently wide frequency band, whereby distortion components are made detectable without taking the temporal average of the equalization error.

In accordance with the distortion compensation amplifying device according to the second embodiment of the invention (the second amplifying device), the signal obtained by branching the output of the power amplifier 5 by a directivity coupler 6 is down-converted by a mixer 7, such a frequency band as contains the fifth-order distortion (IM5) is sampled by the A/D converter 9 and is subjected to the orthogonal modulation by the orthogonal demodulator 14, the equalizer 15 of the distortion detection unit 17 detects the equalization error e(n) between the orthogonal demodulation signal u(n) and the input signal d(n) of the predistorter as is the reference symbol and outputs the error e(n) to the control unit 18 as the distortion value, and the control unit 18 performs the distortion compensation by controlling the predistorter on the basis of the distortion value. This brings forth the advantage that temporal waveforms are compared in a state where delays and frequency characteristics are appropriately compensated, so the non-linear distortion components can be easily detected.

Besides, in accordance with the second amplifying device, the uncertainties of the frequency characteristics of the connected portions can be absorbed by the equalizer 15 in the same manner as in the first amplifying device, and the number of man-hour of adjustments decreases to bring forth the advantage that a manufacturing cost can be lowered.

Next, a distortion compensation amplifying device according to the third embodiment of the invention will be described.

The third distortion compensation amplifying device (third amplifying device) averages errors as they are vectors, as to only a CDMA signal of specified amplitude, and it controls a predistorter by using the average as a distortion value.

The configuration of the third amplifying device is substantially the same as that of the first amplifying device, and it shall therefore be omitted from illustration. However, a distortion detection unit includes an equalizer, and an averaging portion (error averaging portion) which averages error vectors outputted from the equalizer, as they are vectors.

The equalizer of the third amplifying device detects errors for a predistorter input signal d(n) of specified amplitude. By way of example, the equalizer changes the "specified amplitude" cyclically and successively from a low level to a high level in a preset order, and it detects the error vectors at the respective amplitudes and outputs them to the averaging portion.

Here, in the averaging portion of the distortion detection unit, $e(n)/d(n)=(e(n)\cdot d^*(n))/|d(n)|^2$ are averaged for the detected error vectors e(n) (the vectors may well be normalized by u(n), not by d(n)). On this occasion, the error vectors e(n) are expressed relatively to the differences of the amplitude, and hence, equalizer training must be always performed under the same conditions irrespective of the specified amplitude.

Figure 6:
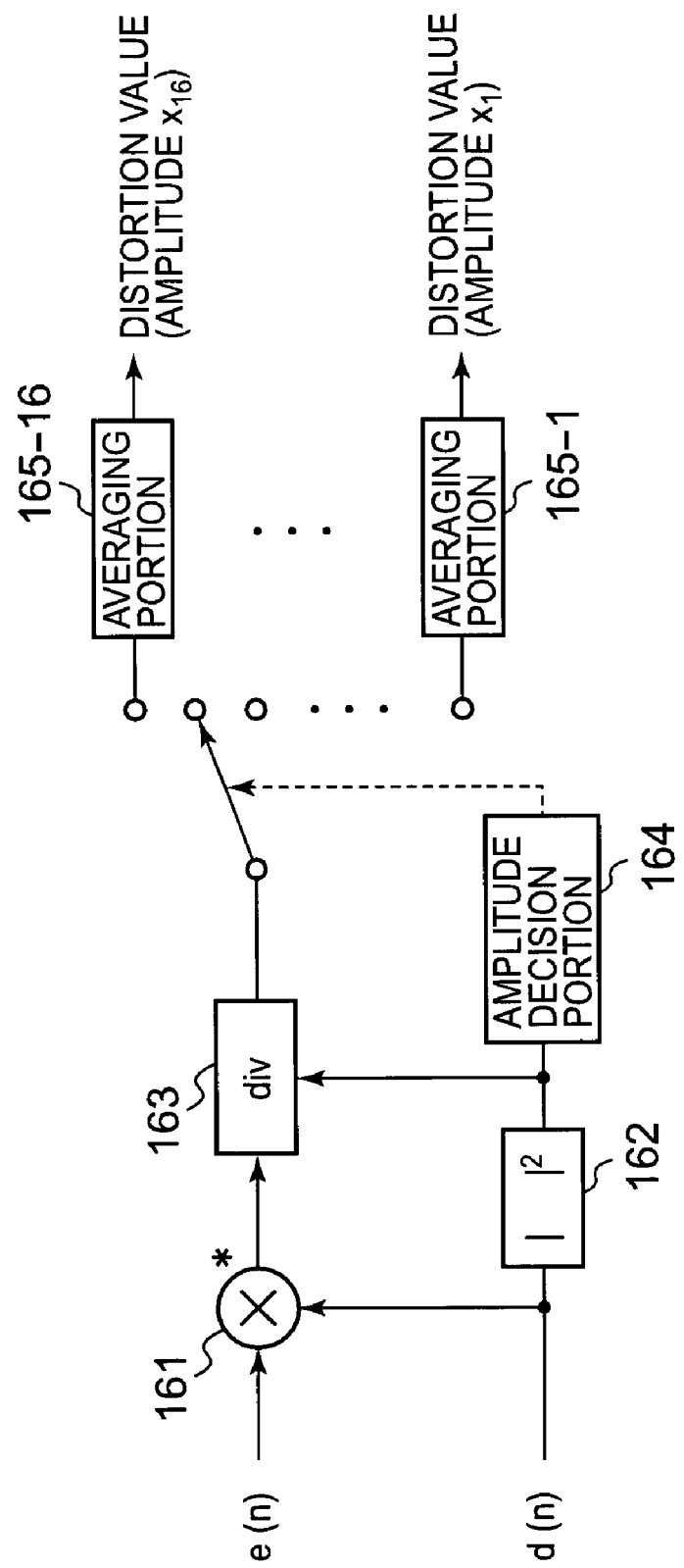
FIG. 6 is a configurational block diagram of the error averaging portion of the third amplifying device of the invention.
Figure 7:
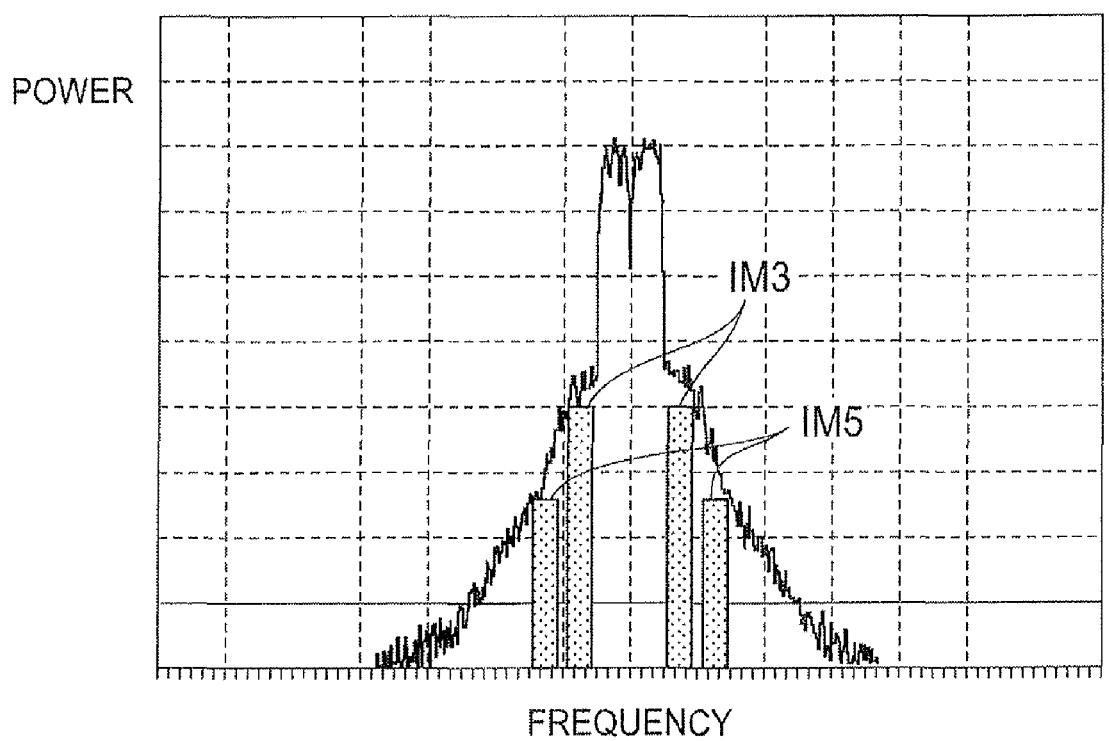
FIG. 7 is an explanatory diagram showing the output spectrum of a power amplifier having a non-linear characteristic (W-CDMA, two carriers (detuning frequency: 5 MHz)).

The control unit controls the predistorter with a distortion value being the average value of the error vectors thus detected. Here, the configuration of the error averaging portion will be described with reference to FIG. 6. FIG. 6 is a configurational block diagram of the error averaging portion of the third embodiment.

As shown in FIG. 6, the error averaging portion of the distortion detection unit is configured of a complex conjugate multiplier 161, a squaring portion 162, a divider 163, an amplitude decision portion 164, and averaging portions 165-1 to 165-16 in a number equal to the number of typical points. The averaging portions 165-1 to 165-16 average the error vectors corresponding to amplitudes x1 to x16, respectively.

Besides, in the error averaging portion, the complex conjugate multiplier 161 executes the complex conjugate multiplication between the error vector e(n) detected by the equalizer and the reference signal d(n), the result of the complex multiplication is divided by the square of the amplitude component of the reference signal d(n) in the divider 163, the amplitude decision portion 164 judges the amplitude of the input signal and outputs the result of the division to the averaging portion 165 corresponding to the amplitude, so as to average such results, and the result of the averaging is outputted to the control unit as the distortion value.

The predistorter is provided with a distortion compensation table corresponding to the amplitude values. In case of a configuration in which the table is updated by the interpolations of the typical points, the averaging portions detect the distortion values to the number of the typical points by using the error vectors from the equalizer, and the control unit updates the typical points by using the distortion values which correspond to the amplitudes. A method for the updating is a method in which a value obtained by multiplying each distortion value by a step coefficient of at most one is subtracted from the value of the corresponding typical point. A method for creating the table by interpolating the typical points may be the same as in JP-A-2005-73032.

Besides, in case of a configuration in which the distortion compensation table is generated by power functions, the control unit compares partial differentiation values based on the respective coefficients of the power functions at the specified amplitude of the error detection and at any other amplitude, and it finds the direction of the change of the distortion at the pertinent amplitude in the case of increasing or decreasing the coefficient. Therefore, the control unit performs the control of determining the updating method of the respective coefficients, so as to decrease the error, on the basis of the direction of the change and the direction of the corresponding error vector (the lead or lag of a phase and the magnitude of the amplitude).

In accordance with the distortion compensation amplifying device according to the third embodiment of the invention (the third amplifying device), the signal obtained by branching the output of the power amplifier by the directivity coupler is down-converted by the mixer 7, and the signal is sampled by the A/D converter and is subjected to the orthogonal modulation by the orthogonal demodulator. In the case where the equalizer of the distortion detection unit detects the error vector e(n) relative to the orthogonal modulation signal u(n), with the CDMA signal of specified amplitude as the reference symbol d(n), it changes the specified amplitude cyclically from the low level to the high level and detects the error vectors for the respective amplitudes, and it averages the values e(n)/u(n) and outputs the averages to the control unit as the distortion values. The control unit controls the predistorter on the basis of the distortion values so as to compensate the distortion. Since the distortion is detected as the vector, there is the advantage that convergence can be made faster by using the distortion compensation algorithm faster than the perturbation method.

Next, a distortion compensation amplifying device according to the fourth embodiment of the invention (fourth amplifying device) will be described.

The fourth amplifying device disposes FIR filters in a predistorter, and a control unit adaptively controls the tap coefficients of the FIR filters on the basis of an equalization error detected by the equalizer of a distortion detection unit.

Figure 12:
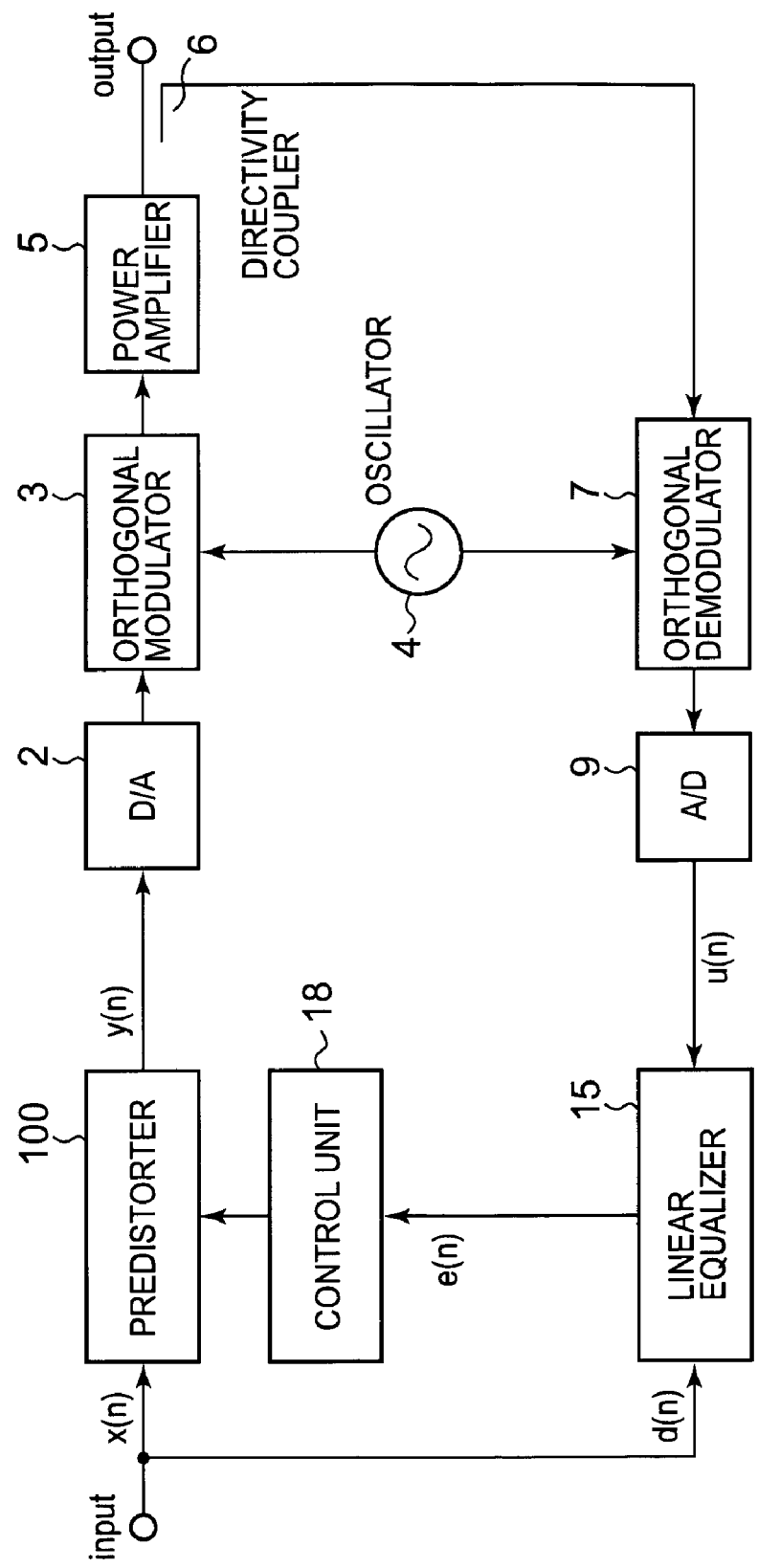
FIG. 12 is a configurational block diagram of the fourth amplifying device of the invention.

The configuration of the fourth amplifying device will be described with reference to FIG. 12. FIG. 12 is a configurational block diagram of the fourth amplifying device of the invention.

As shown in FIG. 12, the fourth amplifying device is configured of a predistorter 100, a D/A converter 2, an orthogonal modulator 3, an oscillator 4, a power amplifier 5, a directivity coupler 6, an orthogonal demodulator 7, an A/D converter 9, an equalizer ("linear equalizer" in the figure) 15 and a control unit 18. The basic configuration of the fourth amplifying device is substantially the same as that of the second amplifying device described before, but the configurations and operations of the predistorter 100 and the control unit 18 are partly different from those in the second amplifying device.

Besides, in the fourth amplifying device, as in each of the first-third amplifying devices described before, an input signal has non-linear distortions, ascribable to the power amplifier 5, compensated by the predistorter 100, and it is subjected to D/A conversion, and the resulting signal is subjected to orthogonal modulation by the orthogonal modulator and is up-converted by a radio frequency from the oscillator 4, so as to become an output signal after amplification by the power amplifier 5.

The output signal from the power amplifier 5 is branched by the directivity coupler 6, the branched signal is fed back and is down-converted and subjected to orthogonal demodulation by the orthogonal demodulator 7, the demodulated signal is converted into a digital signal by the A/D converter 9, an equalization error e(n) is calculated in the equalizer 15 by equalizing the orthogonal demodulation signal u (n) of the feedback signal with the input signal d(n) of the predistorter, and the control unit 18 performs the control of the predistorter so as to minimize the equalization error. Here, linear distortions which appear due to the analog elements of the directivity coupler 6, et seq. are removed in the equalizer 15, and the remaining equalization error e(n) is ascribable to non-linear distortion components having appeared in the power amplifier 5.

Figure 13:
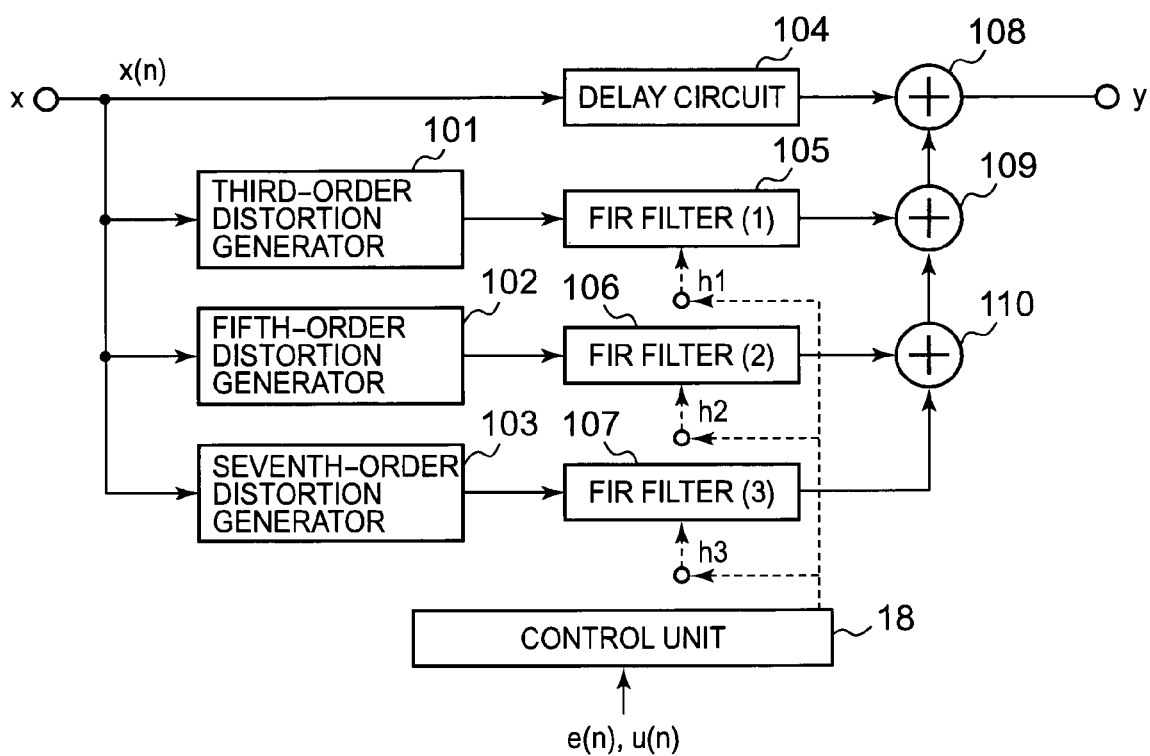
FIG. 13 is a configurational block diagram of the predistorter 100 of the fourth amplifying device.

The configuration of the predistorter 100 being the featuring part of the fourth amplifying device will be concretely described. FIG. 13 is a configurational block diagram of the predistorter 100 of the fourth amplifying device.

As shown in FIG. 13, the predistorter 100 of the fourth amplifying device includes a third-order distortion generator 101, a fifth-order distortion generator 102, a seventh-order distortion generator 103, a delay circuit 104, a first FIR filter (FIR filter (1)) 105, a second FIR filter (FIR filter (2)) 106, a third FIR filter (FIR filter (3)) 107 and adders 108-110.

Figure 9:
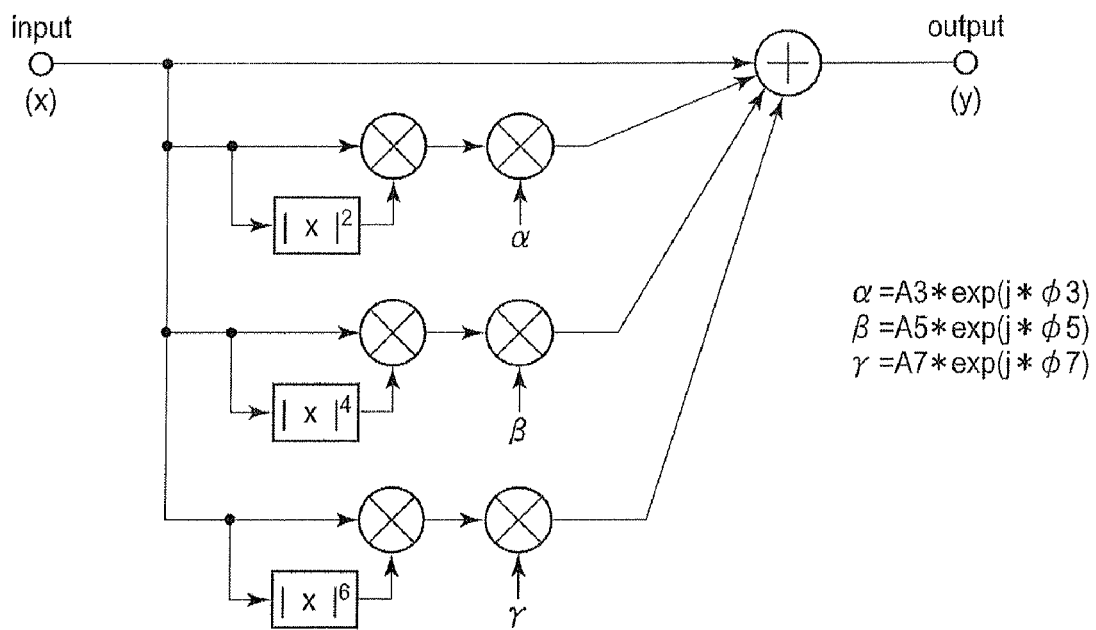
FIG. 9 is a block diagram showing the schematic configuration of a predistorter 1.

The third-order distortion generator 101 is the same as the configuration of a first stage in the prior-art predistorter shown in FIG. 9, and it calculates $|x|^2 \cdot x$. Likewise, the fifth-order distortion generator 102 calculates $|x|^4 \cdot x$, and the seventh-order distortion generator 103 calculates $|x|^6 \cdot x$.

The delayer 104 delays the input signal x(n) a fixed time period.

The first FIR filter 105 is a filter which executes a product-sum operation for the third-order distortion on the basis of an optimal tap coefficient h1 given by the control unit 18. Likewise, the second FIR filter 106 and the third FIR filter 107 are respectively given optimal tap coefficients h2 and h3 by the control unit 18, so as to execute operations.

That is, the point of difference between the configuration of the prior-art predistributor in FIG. 9 and that of the predistorter of the fourth amplifying device is that, in the predistributor of the fourth amplifying device, the outputs of the respective distortion generators are passed through the FIR filters instead of being multiplied by the coefficients ($\alpha$, $\beta$ and $\gamma$).

The control unit 18 receives the equalization error e(n) from the equalizer 15, and a third-order distortion signal, a fifth-order distortion signal and a seventh-order distortion signal, and it calculates the optimal tap coefficients h1, h2 and h3 of the respective FIR filters 105, 106 and 107 in conformity with an adaptation algorithm such as LMS, so as to given them to the corresponding FIR filters.

The adder 110 adds up the output of the third FIR filter 107 and that of the second FIR filter 106, while the adder 109 adds up the output of the adder 110 and that of the first FIR filter 105.

The adder 108 adds up the output of the adder 109 and the input signal delayed by the delay circuit 104, thereby to generate the output signal of the predistorter 100.

Next, a method for controlling the predistorter of the above configuration in the control unit 18 will be described.

The coefficients h1, h2 and h3 in the first, second and third FIR filters are respectively expressed by:

$$h1(n+1)=h1(n)+\mu 1 \cdot u(n) \cdot e(n)$$

$$h2(n+1)=h2(n)+\mu 2 \cdot u(n) \cdot e(n)$$

$$h3(n+1)=h3(n)+\mu 3 \cdot u(n) \cdot e(n)$$

As stated before, e(n) denotes the equalization error ascribable to the non-linear distortions which have not been equalized by the linear equalizer 15, u(n) denotes the orthogonal modulation signal of the feedback signal, and $\mu 1$, $\mu 2$ and $\mu 3$ denote the step gains which determine the response characteristics of the coefficient updating. When the step gains are made large, a convergence rate becomes high, but the residual error becomes large, and when the step gains are made small, the convergence rate becomes low, but the residual error can be made small.

Figure 10:
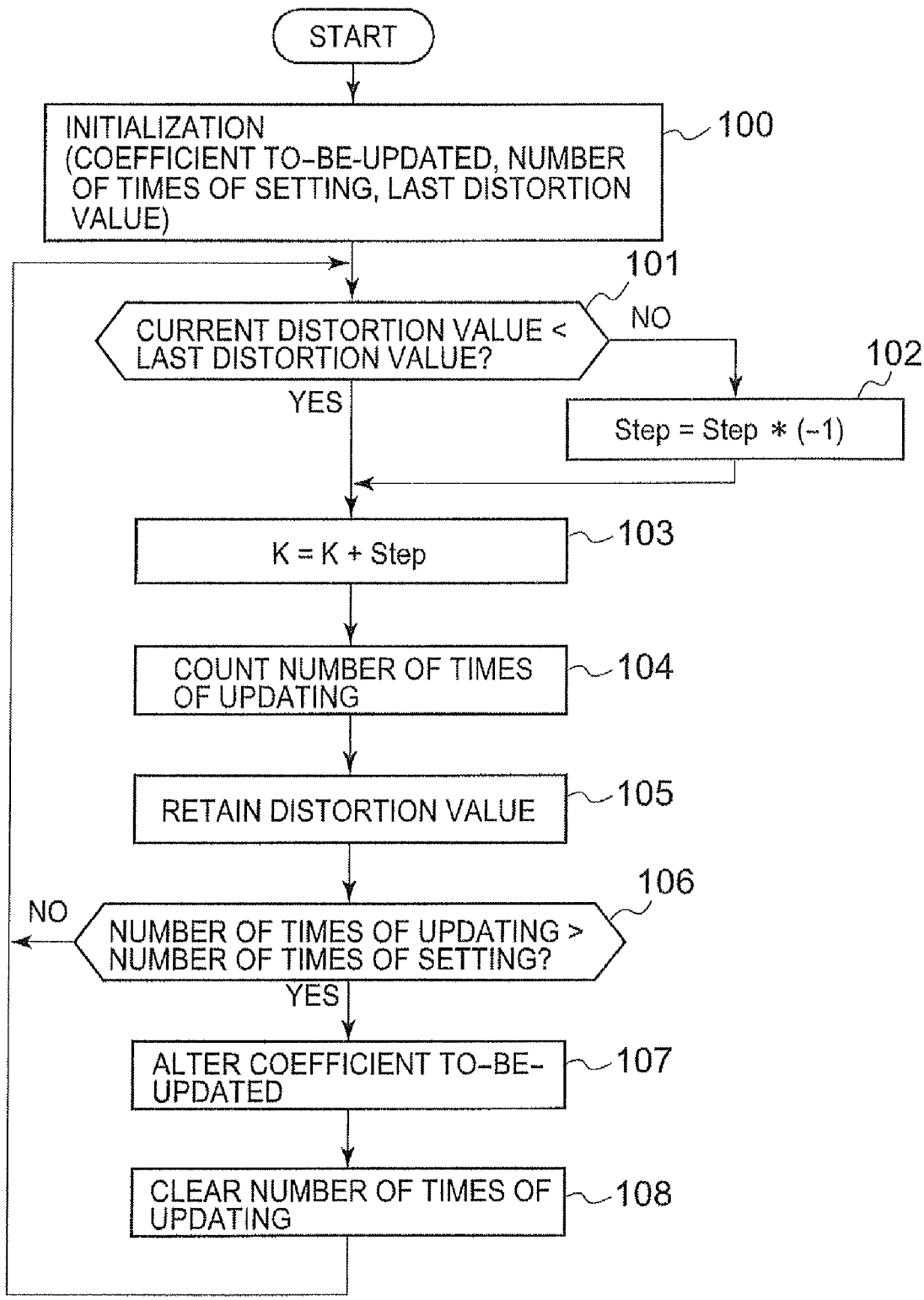
FIG. 10 is a flow chart diagram showing a control in a control unit 13 as employs a perturbation method.
Figure 11:
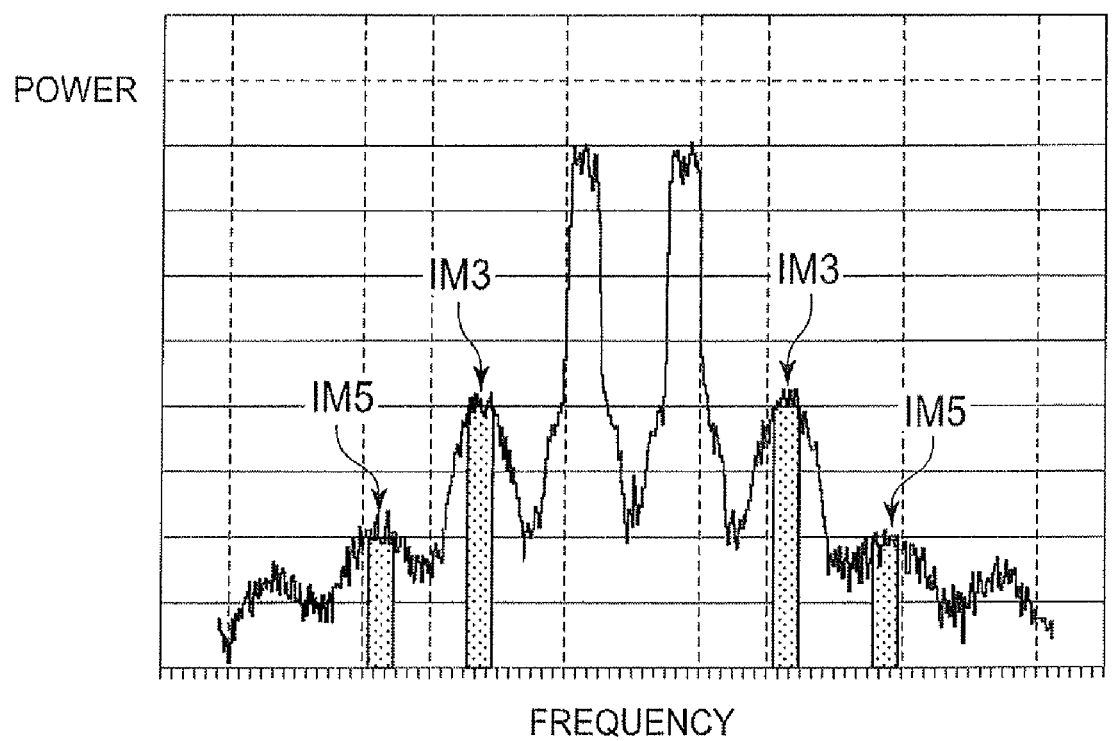
FIG. 11 is an explanatory diagram showing another output spectrum of a power amplifier having a non-linear characteristic (W-CDMA, two carriers (detuning frequency: 15 MHz)).

Besides, in the fourth amplifying device, the coefficients h1, h2 and h3 are updated in the same manner as in the prior-art control based on the LMS as shown in FIG. 10.

As a method for setting the step gains $\mu 1$, $\mu 2$ and $\mu 3$, the step gains may be set so that all the response characteristics for updating the coefficients h1, h2 and h3 may become the same, or the step gains of, for example, $\mu 1 > \mu 2 > \mu 3$ may well be set so that the coefficients may converge in a specified order, for example, in the order of h1(n), h2(n) and h3(n). Alternatively, in a case where the coefficients are to be converged in the order of h3(n), h2(n) and h1(n) in the reverse order, the step gains may be set as $\mu 1 < \mu 2 < \mu 3$.

In this manner, the coefficient updating is operated in succession, whereby the stabilization of the convergence can be attained.

As another method for setting the step gains, the coefficients can be updated one by one in the order of h1(n)→h2(n)→h3(n)→h1(n) in such a manner that, before the linear equalizer 15 converges, all the step gains $\mu 1$, $\mu 2$ and $\mu 3$ are set at "0s"; that, when the linear equalizer 15 has converged, a suitable value is first set for the step gain $\mu 1$, thereby to update only the coefficient h1(n); that, when a state has been established under which the value of the equalization error e(n) does not approach to "0" any more, the step gain $\mu 1$ is returned to "0", whereupon a suitable value is set for the step gain $\mu 2$, thereby to update only the coefficient h2(n); and so forth. Thus, the stabilization of the convergence can be attained.

In accordance with the distortion compensation amplifying device (fourth amplifying device) according to the fourth embodiment of the invention, the FIR filters 105, 106 and 107 are respectively disposed at the outputs of the third-order distortion generator 101, fifth-order distortion generator 102 and seventh-order distortion generator 103 of the predistorter 100, the equalizer 15 for detecting the distortions detects the equalization error e(n) between the orthogonal demodulation signal u(n) and the input signal d(n) of the predistorter as is the reference symbol and outputs the equalization error e(n) to the control unit 18 as the distortion value, and the control unit 18 updates the coefficients of the respective FIR filters in conformity with the adaptation algorithm on the basis of the distortion value. Therefore, a processing quantity is decreased by dispensing with the FFT in the distortion detection, to bring forth the advantage that the distortion compensation of high precision can be performed without increasing a circuit size.

Besides, in accordance with the fourth amplifying device, the step gains in the case of converging the coefficients in the respective FIR filters are set so as to converge in the order of the third-order distortion, fifth-order distortion and seventh-order distortion, whereby the stability of the convergence is enhanced, to bring forth the advantage that the stable distortion compensation can be performed.

Next, another amplifying device with a distortion control function will be described.

In recent years, a Doherty amplifier has come into the limelight as a high-efficiency amplifier.

Figure 24:
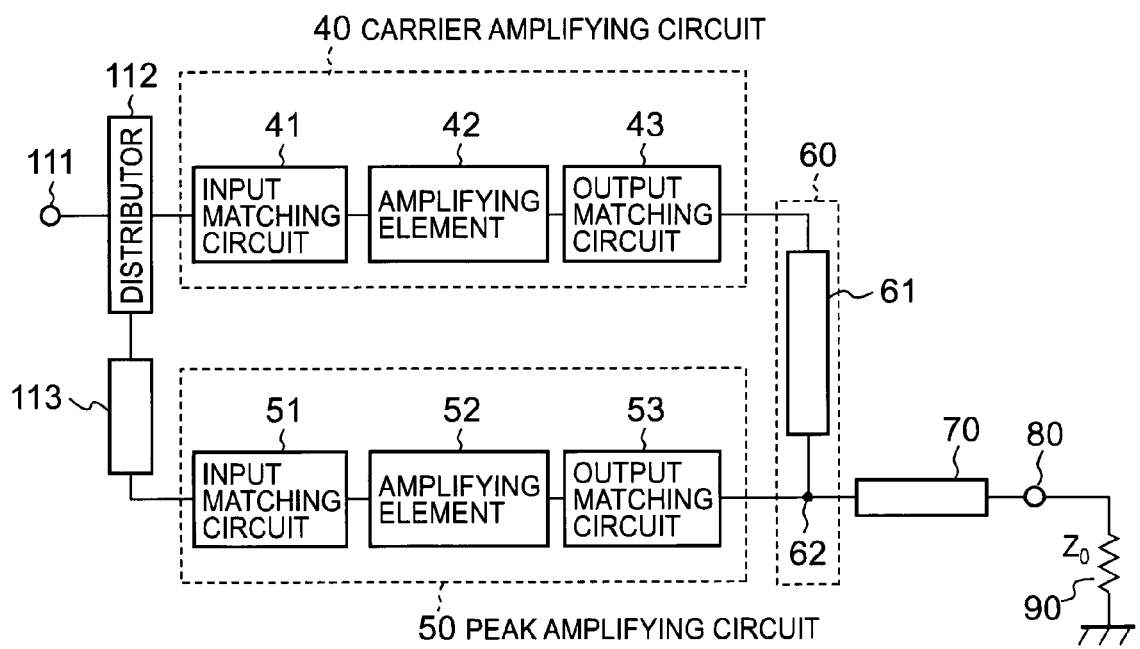
FIG. 24 is a block diagram showing the configuration of a prior-art Doherty amplifier.

FIG. 24 is a block diagram showing the configuration of the Doherty amplifier in the prior art.

A signal inputted to an input terminal 111 is distributed by a distributor 112, and one of the resulting signals is inputted to a carrier amplifying circuit 40. The carrier amplifying circuit 40 is configured of an amplifying element 42, an input matching circuit 41 for matching with the input side of the amplifying element 42, and an output matching circuit 43 for matching with the output side of the amplifying element 42. The output of the carrier amplifying circuit 40 is subjected to impedance transformation by a $\lambda/4$ transformer 61.

The other signal distributed by the distributor 112 has its phase delayed 90 degrees by a phase shifter 113, and is inputted to a peak amplifying circuit 50. Likewise to the carrier amplifying circuit 40, the peak amplifying circuit 50 is configured of an input matching circuit 51, an amplifying element 52 and an output matching circuit 53. The outputs of the $\lambda/4$ transformer 61 and the peak amplifying circuit 50 are synthesized at a node (synthesis point) 62. The $\lambda/4$ transformer 61 and the node 62 as are combined shall be called "Doherty synthesis unit 60". The synthesized signal is subjected to impedance transformation by a $\lambda/4$ transformer 70 in order to match with an output load $Z_0$, and is fed to the load 90 through an output terminal 80.

The carrier amplifying circuit 40 and the peak amplifying circuit 50 differ in the point that the amplifying element 42 is biased in the class-AB, whereas the amplifying element 52 is biased in the class-B or C. Therefore, the amplifying element 42 operates alone up to an input with which the amplifying element 52 operates. When the amplifying element 42 enters its saturation region, and the linearity thereof begins to collapse, the amplifying element 52 begins to operate, and the output of the amplifying element 52 is fed to the load 90, so as to drive the load 90 in cooperation with the output of the amplifying element 42. On this occasion, the load line of the output matching circuit 43 moves from a high resistance to a low resistance, but the amplifying element 42 lies in the saturation region, so that an efficiency is favorable. When the input from the input terminal 111 increases still further, also the amplifying element 52 of the peak amplifying circuit 50 begins to be saturated, but both the amplifying elements 42 and 52 are saturated, and hence, the efficiency is favorable also on this occasion.

Besides, as relevant known techniques, there have been considered amplifiers with distortion control functions, in each of which, in a Doherty amplifier, the appearance of distortions is decreased by controlling the bias of an amplifying element in a peak amplifier, or by controlling the biases of both amplifying elements in a carrier amplifier and a peak amplifier. As the known techniques, there are JP-A-2005-117599, JP-A-2002-50933, and JP-T-2005-516524 (where the term "JP-T" means a published Japanese translation of a PCT patent application).

In addition, the amplifying device furnished with the feed-forward distortion compensation or predistortion distortion compensation in the prior art has the problem that it falls into a state where distortions cannot be fully compensated, and the problem that intermodulation distortions after the distortion compensation disperse, and that, when a margin is enlarged in order to make up for the dispersion, an efficiency degrades, with the result that the efficiency cannot be brought out to its limitation.

Besides, with the prior-art Doherty amplifier, as the efficiency is made more favorable, an AM-AM (an output amplitude level versus an input amplitude level) conversion characteristic and an AM-PM (an output phase rotation magnitude versus an input amplitude level) conversion characteristic degrade more, and even in the amplifier with the distortion control function, there is the problem that the decrease of distortions is not sufficient, so the efficiency cannot be brought out to its limitation.

Therefore, another amplifying device with a distortion compensation function has been proposed in order to solve the above problems, and it has for its object to provide the amplifying device with the distortion compensation function, in which the AM-AM conversion characteristic and the AM-PM conversion characteristic can be kept favorable, and the dispersion of the intermodulation distortions after the distortion compensation can be absorbed, so the efficiency can be brought out to its limitation.

Another amplifying device with a distortion control function is characterized by including a Doherty amplifier which is configured of a carrier amplifying circuit that includes an amplifying element operating in the class-AB, a peak amplifying circuit that includes an amplifying element having its amplification operation controlled by a control signal inputted from a control terminal, and synthesis means for synthesizing signals amplified by the carrier amplifying circuit and the peak amplifying circuit, so as to output the synthesized signal, and a predistortion distortion compensation circuit which is configured of a predistorter that compensates the non-linear distortions of the Doherty amplifier, a distortion detection unit that detects intermodulation distortions contained in the output signal of the Doherty amplifier, and a control unit that controls the predistorter so as to decrease a distortion value detected by the distortion detection unit, and that controls the amplifying element in the peak amplifying circuit so that the intermodulation distortions detected by the distortion detection unit may become target values.

In accordance with another amplifying device with a distortion control function, intermodulation distortions in a Doherty amplifier are permitted to converge to target intermodulation distortions, and the dispersion of the intermodulation distortions can be absorbed, and the target values of the intermodulation distortions are set at appropriate values, whereby an efficiency is permitted to be brought out to its limitation.

Now, one embodiment of the other amplifying device with the distortion control function will be described with reference to the drawings.

Figure 14:
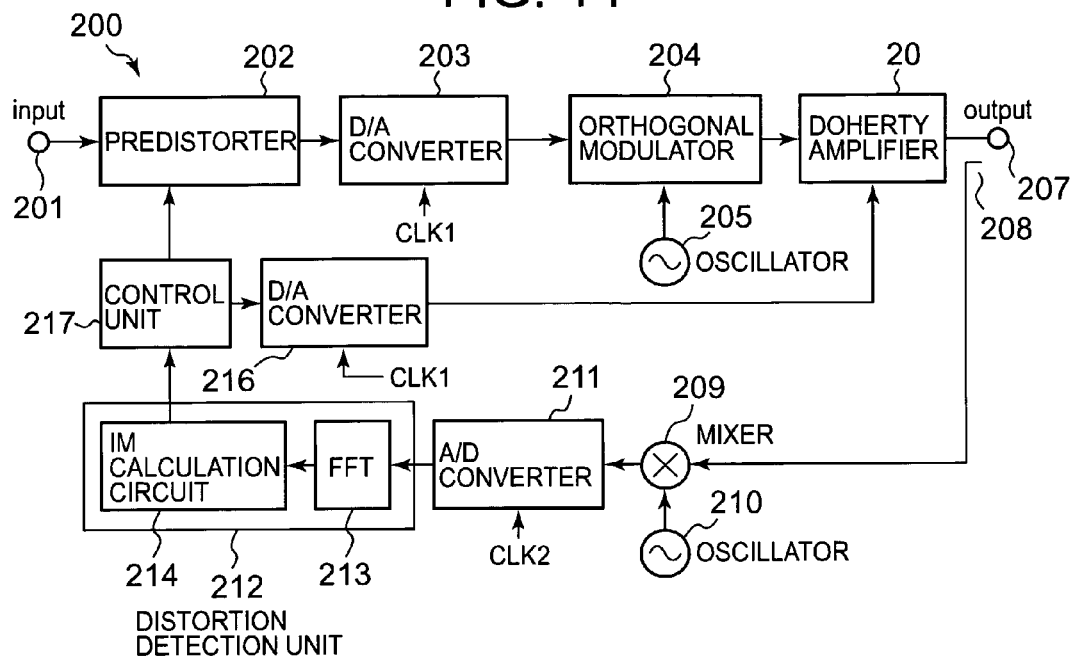
FIG. 14 is a block diagram showing the configuration of the whole amplifying device with a distortion control function, according to one embodiment of the invention.
Figure 15:
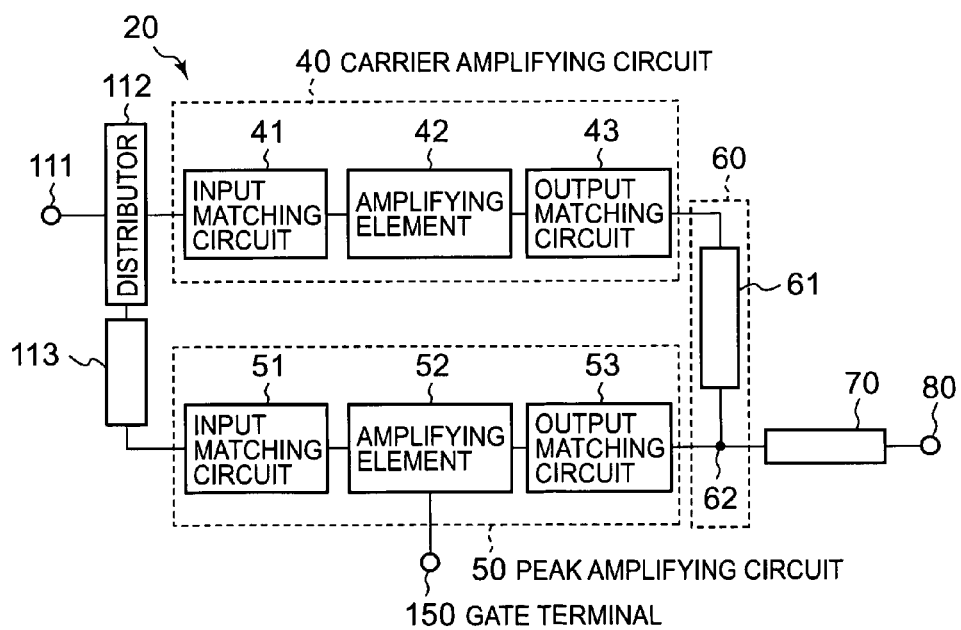
FIG. 15 is a block diagram showing the detailed configuration of a Doherty amplifier in the embodiment.

FIG. 14 is a block diagram showing the configuration of an amplifying device with a distortion control function, according to the embodiment of the other amplifying device with the distortion control function, and the amplifying device is configured by combining a predistortion distortion compensation circuit 200 and a Doherty amplifier 20. FIG. 15 is a block diagram showing the detailed configuration of the Doherty amplifier 20.

As shown in FIG. 14, a signal is inputted to the input terminal 201 of the predistortion distortion compensation circuit 200. The input signal has its non-linear distortions compensated by a predistorter 200, and the resulting signal is sent to a D/A converter 203. The predistorter 202 is configured in the same manner as shown in FIG. 12. The D/A converter 203 converts the digital signal into an analog signal in synchronism with a clock signal CLK1, and outputs the analog signal to an orthogonal modulator 204. The orthogonal modulator 204 subjects the input signal to orthogonal modulation with a signal from an oscillator 205. The signal modulated by the orthogonal modulator 204 is amplified by the Doherty amplifier 20, and is outputted from an output terminal 207.

Besides, part of the output signal of the Doherty amplifier 20 is derived through a directivity coupler 208, and is inputted to a mixer 209. The mixer 209 down-converts the signal derived from the directivity coupler 208, to an IF frequency on the basis of an oscillation frequency from an oscillator 210. The IF signal down-converted by the mixer 209 is converted into a digital signal by an A/D converter 211, and the digital signal is sent to a distortion detection unit 212. The distortion detection unit 212 is configured of a fast Fourier transform circuit (FFT) 213 and an IM calculation circuit 214, and it obtains the distortion values of the signal outputted from the Doherty amplifier 20, so as to output these distortion values to a control unit 217. The control unit 217 adaptively controls the predistorter 202 so that the distortion values detected by the distortion detection unit 212 may decrease, and it also controls the Doherty amplifier 20 so that the intermodulation distortions detected by the distortion detection unit 212 may become target values. In this case, a control signal for the Doherty amplifier 20 as is outputted from the control unit 217 is converted into an analog signal by a D/A converter 216, and the analog signal is sent to the Doherty amplifier 20 and is inputted to the gate terminal 150 of an amplifying element 52 within a peak amplifying circuit 50 as shown in FIG. 15.

The Doherty amplifier 20 is configured as shown in FIG. 15.

The signal modulated by the orthogonal modulator 204 shown in FIG. 14 is inputted to the input terminal 111 of the Doherty amplifier 20. The signal inputted to the input terminal 111 is distributed by a distributor 112, and one of the distributed signals is inputted to a carrier amplifying circuit 40. The carrier amplifying circuit 40 is configured of an amplifying element 42, an input matching circuit 41 for matching with the input side of the amplifying element 42, and an output matching circuit 43 for matching with the output side of the amplifying element 42. The output of the carrier amplifying circuit 40 is subjected to impedance transformation by a λ/4 transformer 61.

The other signal distributed by the distributor 112 has its phase delayed 90 degrees by a phase shifter 113, and is inputted to a peak amplifying circuit 50. The peak amplifying circuit 50 is configured of the amplifying element 52, an input matching circuit 51 for matching with the input side of the amplifying element 52, and an output matching circuit 53 for matching with the output side of the amplifying element 52. The amplifying element 52 includes the gate terminal 150 being a control terminal, and a gate voltage outputted from the D/A converter 216 shown in FIG. 14 is inputted to the gate terminal 150. A semiconductor device such as LD-MOS (Lateral Diffused MOS), GaAs-FET, HEMT or HBT is usually employed as each of the amplifying elements 42 and 52. By the way, in a case where the FET is employed as the amplifying element 52, its operation is controlled by the gate voltage, but in a case where the transistor is employed as the amplifying element 52, its operation is controlled by a base voltage.

In addition, the outputs of the λ/4 transformer 61 and the peak amplifying circuit 50 are synthesized at a node 62. A Doherty synthesis unit 60 is constituted by the λ/4 transformer 61 and the node 62. The signal synthesized at the node 62 is subjected to impedance transformation by a λ/4 transformer 70 in order to match with an output load $Z_0$, and the resulting signal is sent to the output terminal 207 shown in FIG. 14, through an output terminal 80.

In the above configuration, part of the signal outputted from the Doherty amplifier 20 is derived through the directivity coupler 208 and is down-converted into the IF frequency by the mixer 209, and the resulting signal is thereafter converted by the A/D converter 211 into the digital signal, which is sent to the distortion detection unit 212. The distortion detection unit 212 obtains the spectrum of the IF signal by the fast Fourier transform circuit 213. Subsequently, power values at frequencies IM3 (third-order intermodulation distortion) and LM5 (fifth-order intermodulation distortion) calculated from the number of carriers of the modulation signal and the detuning frequencies thereof are set as distortion values in the IM calculation circuit 214. The control unit 217 adaptively controls the predistorter 202 so that the distortion values detected by the distortion detection unit 212 may decrease, and it controls the peak amplifying circuit 50 in the Doherty amplifier 20, through the D/A converter 216 so that the intermodulation distortions detected by the distortion detection unit 212 may become target values.

The signal subjected to the distortion compensation by the predistorter 202 is converted into the analog signal by the D/A converter 203, the analog signal is subjected to the orthogonal modulation by the orthogonal modulator 204, and the modulated signal is sent to the Doherty amplifier 20 so as to be amplified. On this occasion, the Doherty amplifier 20 has the gate of the amplifying element 52 in the peak amplifying circuit 50 controlled by the gate voltage which is given from the control unit 217 to the gate terminal 150 through the D/A converter 216, and the appearance of the intermodulation distortions is suppressed. In addition, the signal amplified by the Doherty amplifier 20 is outputted from the output terminal 207.

Figure 16:
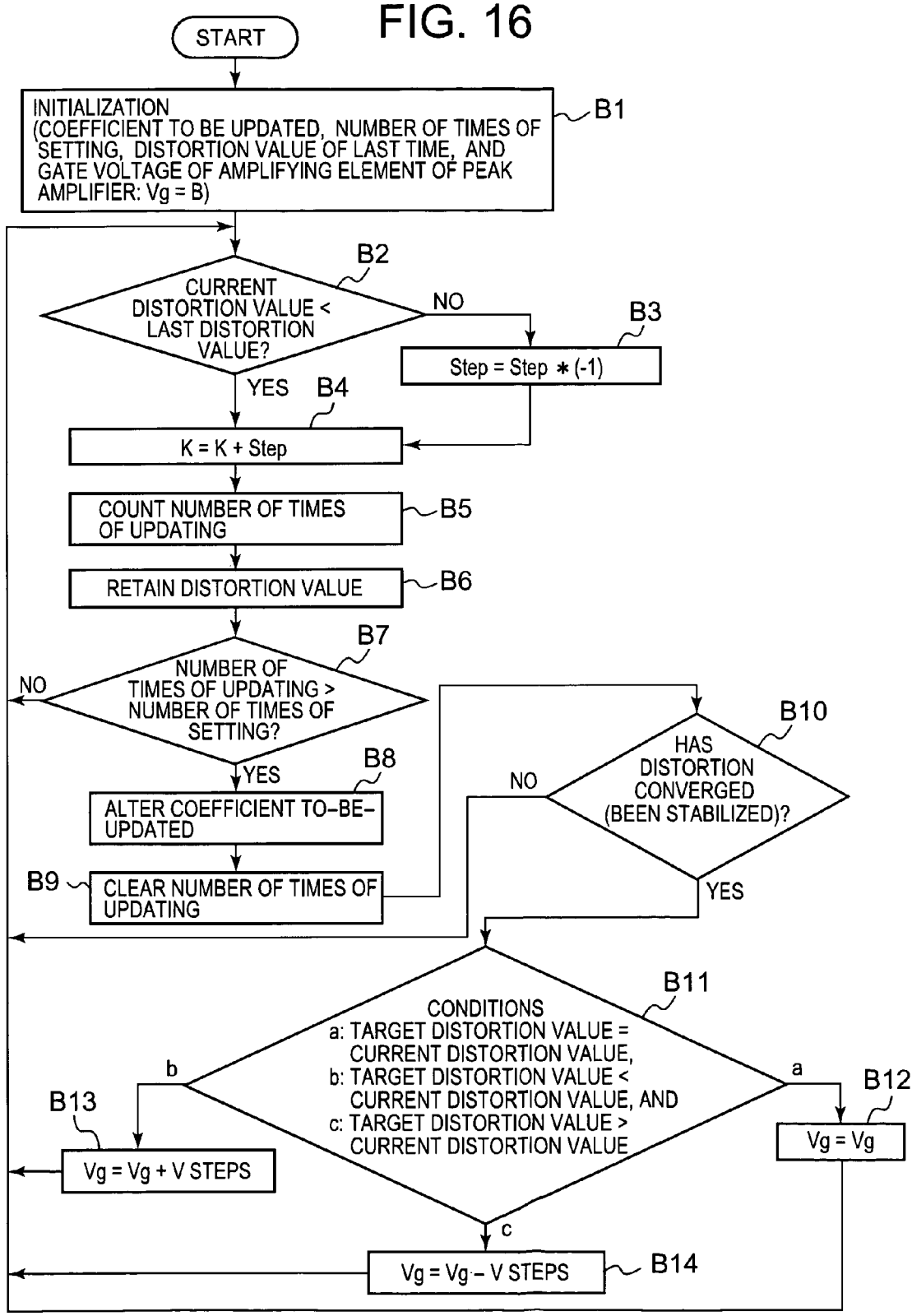
FIG. 16 is a flow chart showing the processing operation of a control unit in the embodiment.

Next, the operation of the control unit 217 in FIG. 14 will be described with reference to a flow chart shown in FIG. 16.

First, the control unit 217 performs initialization such as setting the coefficient to-be-updated, the number of times of setting, and the distortion value of the last time, and setting the gate voltage $V_g$ of the amplifying element 52 of the peak amplifying circuit 50 to "B" (step B1). By way of example, the coefficient K to be updated is set at "Φ3", and a distortion value calculated by the distortion detection unit 212 is compared with the distortion value of the last time (step B2). If the distortion value has become smaller than the last value, the coefficient is further updated in the same direction, that is, the coefficient is updated by the processing of "K=K+Step" (step B4). If the distortion value has become larger, the updating direction is inverted by the processing of "Step=Step*(−1)" (step B3), and thereafter, the operating flow proceeds to the step B4 so as to update the coefficient. Subsequently, the control unit 217 counts how many times the same coefficient Φ3 was updated in succession (step B5), and it retains the detected distortion value (step B6). The retained distortion value will be used in the distortion value comparison of the next time.

Subsequently, the control unit 217 compares the number of times of updating and the preset number of times of setting (step B7). If the number of times of updating is equal to or smaller than the number of times of setting, the control flow returns to the step B2, so as to repeat the updating of the coefficient Φ3. Besides, if the number of times of updating exceeds the number of times of setting, the coefficient to-be-updated is altered (step B8). That is, the coefficient K is altered from Φ3 to A3, and the number of times of updating is cleared (step B9).

Subsequently, the control unit 217 decides if the distortion has converged (has been stabilized) (step B10), thereby to judge if the operations of the steps B2-B9 are to be continued. In a case where the distortion has not converged, the control flow returns to the step B2 so as to repeatedly execute the processing of the steps B2-B10.

In a case where the distortion has been decided to have converged, at the step B10, the control unit 217 compares the distortion value of the current situation and the target distortion value (step B11). That is, the control unit 217 decides which of the following the current situation corresponds to:

a: target distortion value=current distortion value,
b: target distortion value<current distortion value, and
c: target distortion value>current distortion value.

If, as the result of the decision, the distortion value of the current situation and the target distortion value are equal (a), the gate voltage of the amplifying element 52 in the peak amplifying circuit 50 is set at "$V_g = V_g$" (step B12); when the distortion value of the current situation larger than the target distortion value (b), the gate voltage of the amplifying element 52 in the peak amplifying circuit 50 is altered to "$V_g = V_g + V$ steps"(the step width of the voltage to be changed (step B13); and when the distortion value of the current situation is smaller than the target distortion value (c), the gate voltage $V_g$ of the amplifying element 52 in the peak amplifying circuit 50 is altered as "$V_g = V_g - V$ steps" (step B14). Thereafter, the control flow returns to the step B2 so as to continue the processing. Besides, the change width of the gate voltage $V_g$ (the range of the operating points of the peak amplifying circuit 50) has its lower limit set at "A" and its upper limit set at "C".

In this way, the distortion equal to or smaller than the prescribed value can be automatically set, so that the adjustment is facilitated. Alternatively, the gate voltage $V_g$ of the amplifying element 52 may well be manually changed.

Figure 17:
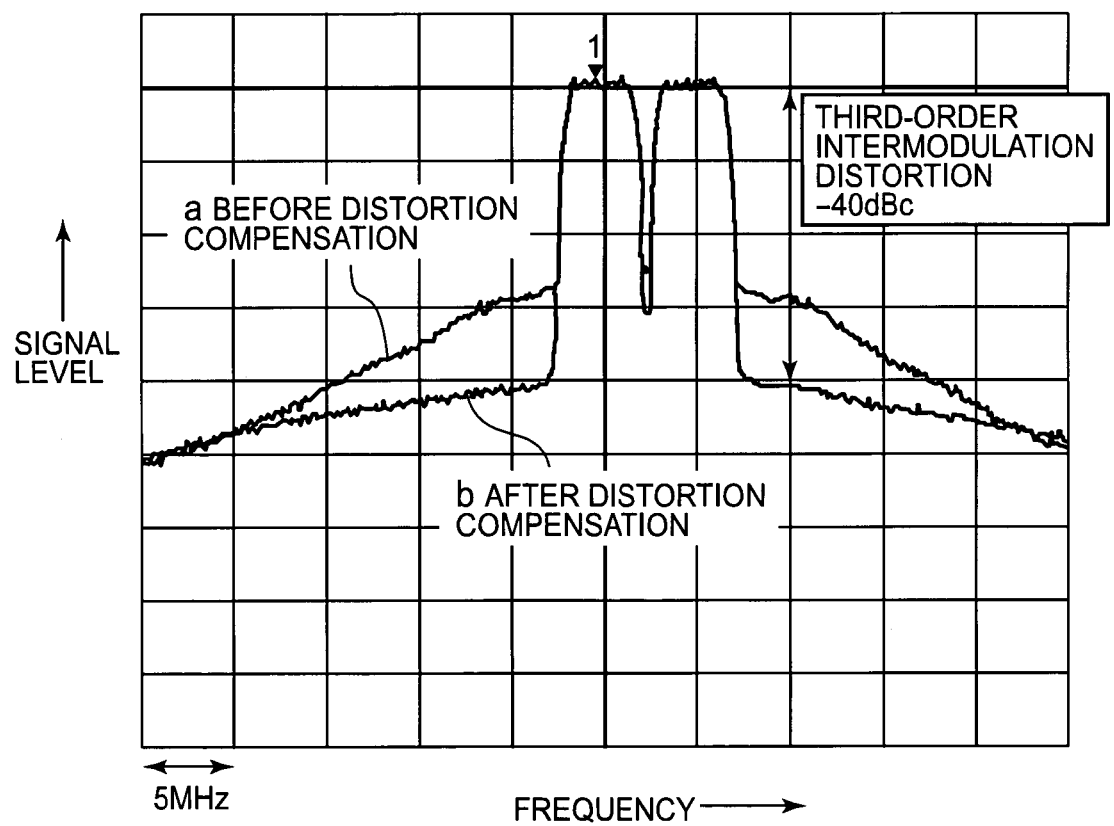
FIG. 17 is a diagram showing a third-order intermodulation distortion characteristic in the case where "A" denotes the gate voltage Vg of a peak amplifier in the embodiment.
Figure 18:
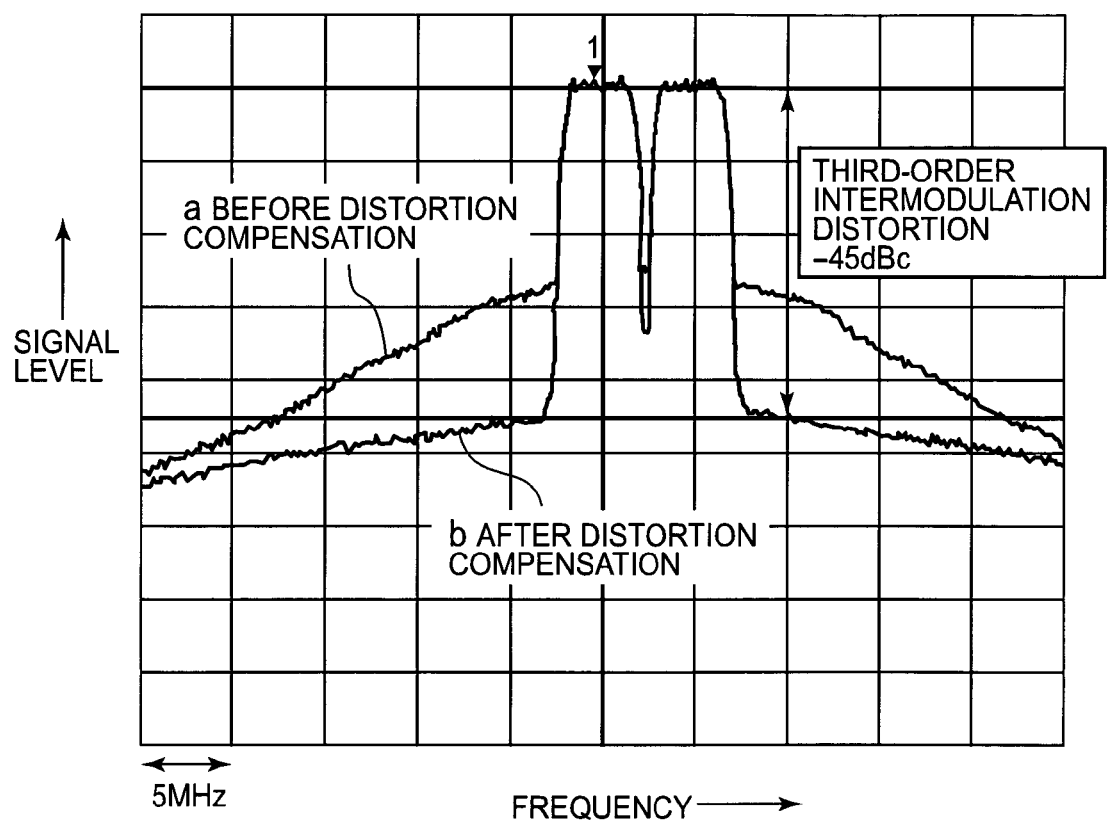
FIG. 18 is a diagram showing a third-order intermodulation distortion characteristic in the case where "B" denotes the gate voltage Vg of a peak amplifier in the embodiment.
Figure 19:
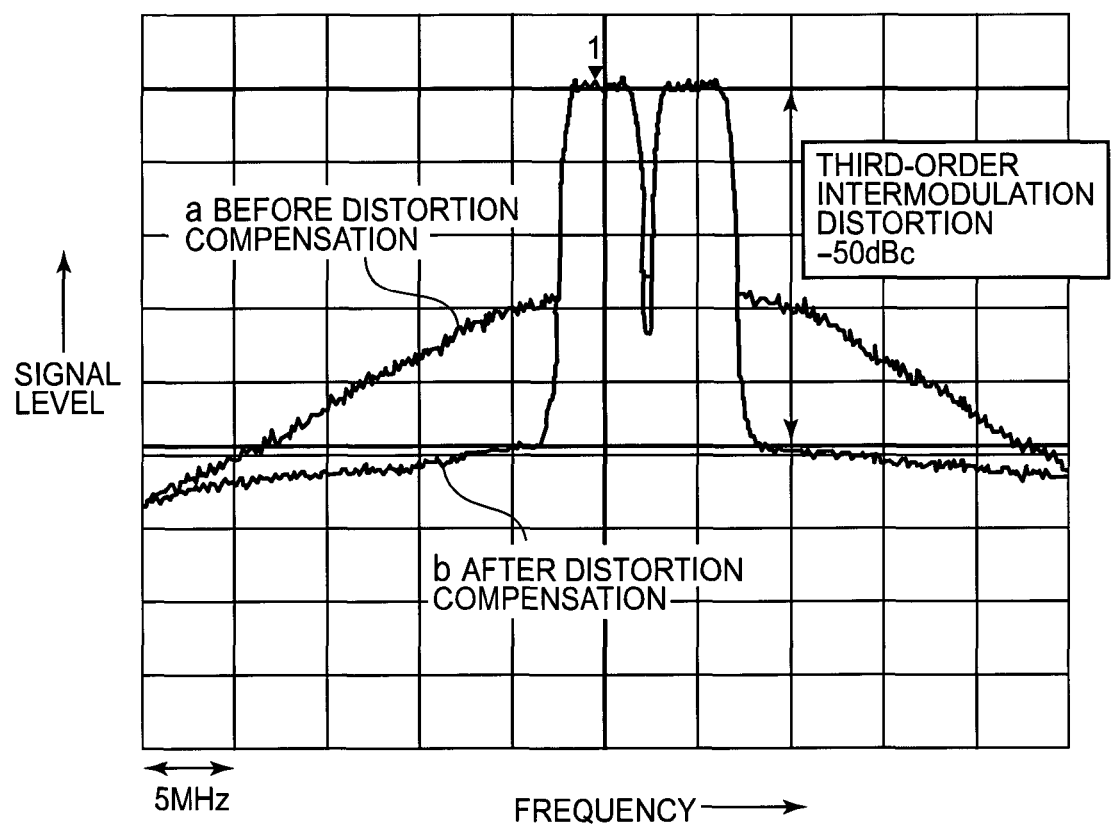
FIG. 19 is a diagram showing a third-order intermodulation distortion characteristic in the case where "C" denotes the gate voltage Vg of a peak amplifier in the embodiment.
Figure 20A:
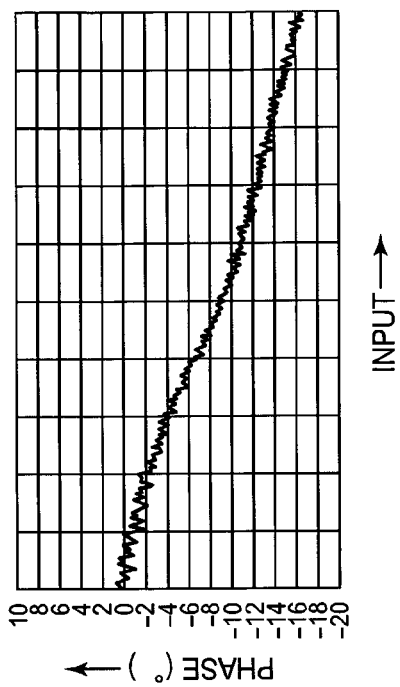
FIG. 20A is a characteristic diagram in the case of the gate voltage Vg=A.
Figure 20B:
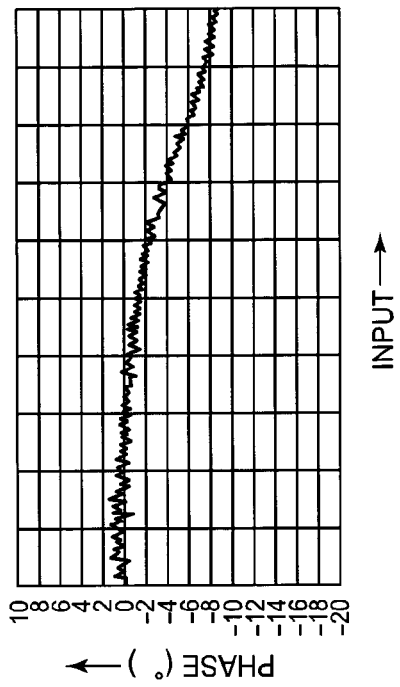
FIG. 20B is a characteristic diagram in the case of the gate voltage Vg=B.
Figure 20C:
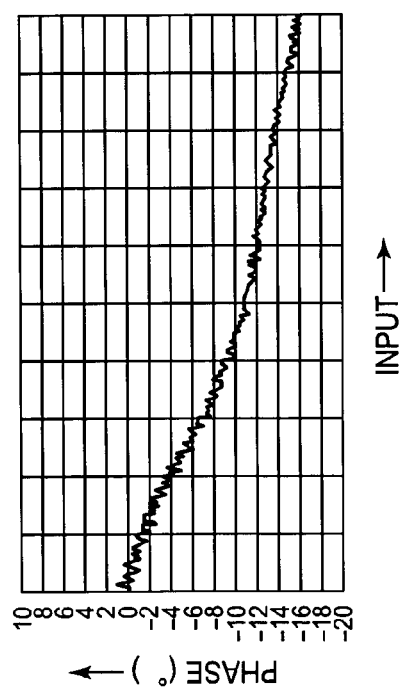
FIG. 20C is a characteristic diagram in the case of the gate voltage Vg=C.
Figure 20D:
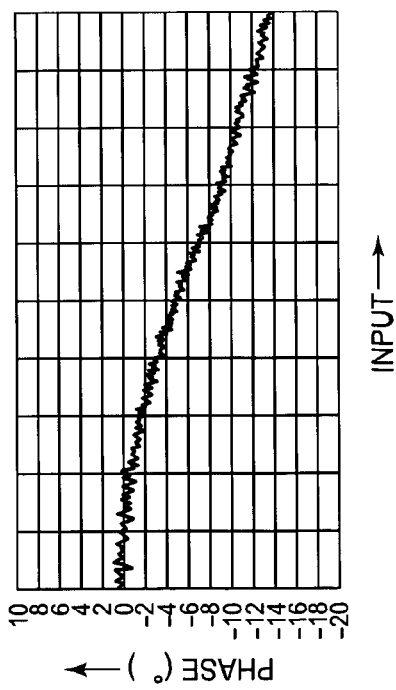
FIG. 20D is a characteristic diagram in the case where the gate voltage Vg is equalized to the gate voltage Vg of a carrier amplifier.

FIGS. 17-19 show distortion compensation characteristics in the cases where the gate voltage $V_g$ of the amplifying element 52 in the peak amplifying circuit 50 shown in FIG. 14 is changed, and FIG. 17 shows the third-order intermodulation distortion characteristic in the case where the gate voltage $V_g$ is set at "A", FIG. 18 the third-order intermodulation distortion characteristic in the case where the gate voltage $V_g$ is set at "B", and FIG. 19 the third-order intermodulation distortion characteristic in the case where the gate voltage $V_g$ is set at "C".

Each of FIGS. 17-19 are illustrated by taking a frequency on the axis of abscissas, and a signal level on the axis of ordinates. a in each figure shows the characteristic before the distortion compensation, and b the characteristic after the distortion compensation.

The amplifying device with the distortion control function attained an efficiency of 40% and the third-order intermodulation distortion (after the distortion compensation) of −40 dBc when the gate voltage $V_g$ is set at A as shown in FIG. 17, an efficiency of 30% and the third-order intermodulation distortion (after the distortion compensation) of −45 dBc when the gate voltage $V_g$ is set at B as shown in FIG. 18, and an efficiency of 20% and the third-order intermodulation distortion (after the distortion compensation) of −50 dBc when the gate voltage $V_g$ is set at C as shown in FIG. 19. In this manner, the efficiency and the intermodulation distortion after the distortion compensation are in the relationship of trade-off, and the efficiency can be brought out to its limitation by setting the target value of the intermodulation distortion (after the distortion compensation) at an appropriate value (design value).

As apparent from the above description, the target intermodulation distortion value can be realized by adjusting the gate voltage $V_g$ of the amplifying element 52. In a case, for example, where the target intermodulation distortion value has been determined as −45 dBc, the gate voltage is set at B. However, the third-order intermodulation distortion value may sometimes be −40 dBc in accordance with the specifications of the amplifier, the gate voltage is set at A on that occasion. Accordingly, the intermodulation distortion after the distortion compensation can be controlled by changing the gate voltage $V_g$ so as to realize the target intermodulation distortion. That is, it is permitted to converge the intermodulation distortion (after the distortion compensation) of the current situation to the target intermodulation distortion (after the distortion compensation), and the dispersion of the intermodulation distortion (after the distortion compensation) can be absorbed.

As an example, the AM-PM conversion characteristic of the amplifying device with the distortion control function will be explained. FIGS. 20(a)-(d) show the AM-PM conversion characteristics in the cases where the gate voltage $V_g$ to be fed to the amplifying element 52 of the peak amplifying circuit 50 has been changed, and (a) shows the characteristic in the case of the gate voltage $V_g$=A, (b) the characteristic in the case of the gate voltage $V_g$=B, (c) the characteristic in the case of the gate voltage $V_g$=C, and (d) the characteristic in the case where the gate voltage $V_g$ is equalized to the gate voltage $V_g$ of the amplifying element 42 of the carrier amplifying circuit 40. Incidentally, the AM-PM conversion characteristic in FIG. 20 is illustrated by taking an input on the axis of abscissas and a phase (°) on the axis of ordinates.

As stated above, when the gate voltage $V_g$ to be fed to the amplifying element 52 is raised, the Doherty amplifier approaches to the AM-PM conversion characteristic of 2-synthesis in the class-AB, and it finally becomes a performance equivalent to the class-AB. Therefore, the Doherty amplifier can be used also as a 2-synthesis circuit of the class-AB, and the class-AB 2-synthesis circuit in the prior art can be replaced with the Doherty circuit.

Incidentally, the predistortion distortion compensation circuit 200 in the foregoing embodiment is a mere example, and it may well have another configuration.

Besides, the Doherty amplifier 20 is also a mere example, and it may well have another configuration.

Other configurational examples of the Doherty amplifier 20 will be described below.

First Configurational Example

Figure 21:
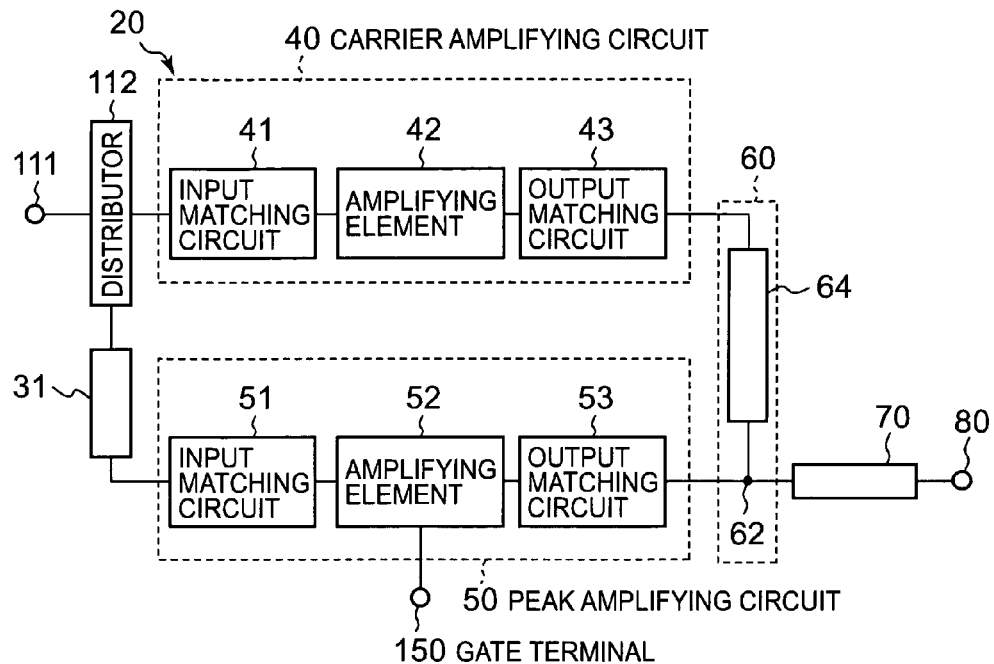
FIG. 21 is a block diagram showing the first configurational example of the Doherty amplifier in the embodiment.

FIG. 21 is a block diagram showing the first configurational example of the Doherty amplifier 20. This Doherty amplifier 20 is such that the $\lambda/4$ transformer 61 in FIG. 15 is replaced with an impedance transformer 64 formed of a transmission line of any desired electrical length, and that the phase shifter 113 is replaced with a phase shifter 31. The remaining configuration is basically the same though constants, etc. are different.

The impedance transformer 64 is formed of the transmission line which has the electrical length of length $l=0-\lambda/2$ or above.

The phase shifter 31 is, in principle, a transmission line which generates a delay corresponding to the impedance transformer 64. The phase shifter 31 serves to perform synthesis in in-phase fashion, and it must absorb the phase difference between the carrier amplifying circuit 40 and the peak amplifying circuit 50, so that the delay thereof is sometimes different from the delay of the impedance transformer 64. The remaining configuration is basically the same as the configuration of the amplifier shown in FIG. 15, though the constants, etc. are different.

In accordance with the above configuration, the length of the transmission line forming the impedance transformer 64 is adjusted, whereby the impedance of the circuit can be set at an optimal value without depending upon the sorts of the amplifying elements, etc., and the performance of the amplifying device can be enhanced.

Second Configurational Example

Figure 22:
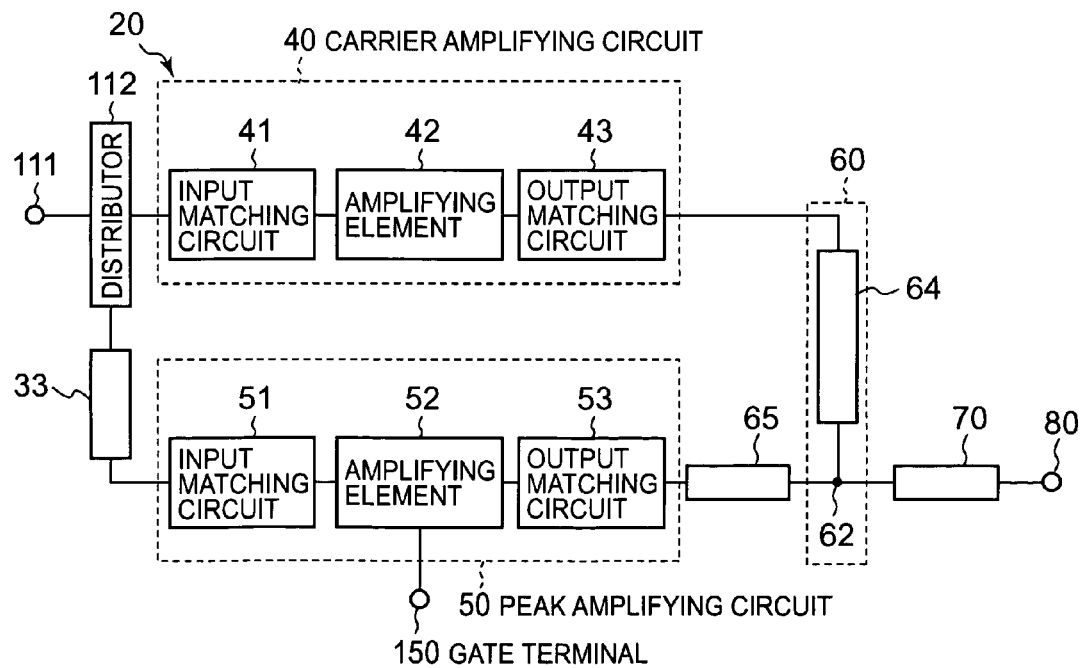
FIG. 22 is a block diagram showing the second configurational example of the Doherty amplifier in the embodiment.

FIG. 22 is a block diagram showing the second configurational example of the Doherty amplifier 20. This second configurational example is such that, in the Doherty amplifier 20 shown in FIG. 21, an impedance transformer 65 is interposed between the peak amplifying circuit 50 and the node 62, while the phase shifter 31 is replaced with a phase shifter 33. The remaining configuration is basically the same.

The node 62 couples output signals from the output matching circuits 43 and 53, through the impedance transformers 64 and 65. The impedance transformer 65 is formed of, for example, a transmission line of any desired length similar to the impedance transformer 64, and it transforms the output impedance of the output matching circuit 53 into a larger impedance so that, when the amplifying element 52 is not operating on account of the low level of an input signal, the signal of the carrier amplifying circuit 40 may be prevented from flowing.

The phase shifter 33 generates the same phase rotation (delay) as that of the impedance transformer 65, and it makes a phase adjustment when the impedance transformer 64 is influential or when the phases of the carrier amplifying circuit 40 and the peak amplifying circuit 50 are different.

The impedance transformer 65 is disposed as stated above, whereby the impedance with the peak amplifying circuit 50 viewed from the side of the node 62 can be set at a larger value, and an amplifier of high efficiency can be configured by suppressing the loss of the carrier amplifying circuit 40 even in a case where the level of the input signal is small, so the output impedance of the output matching circuit 53 does not become sufficiently large.

Third Configurational Example

Figures 23A, 23B:
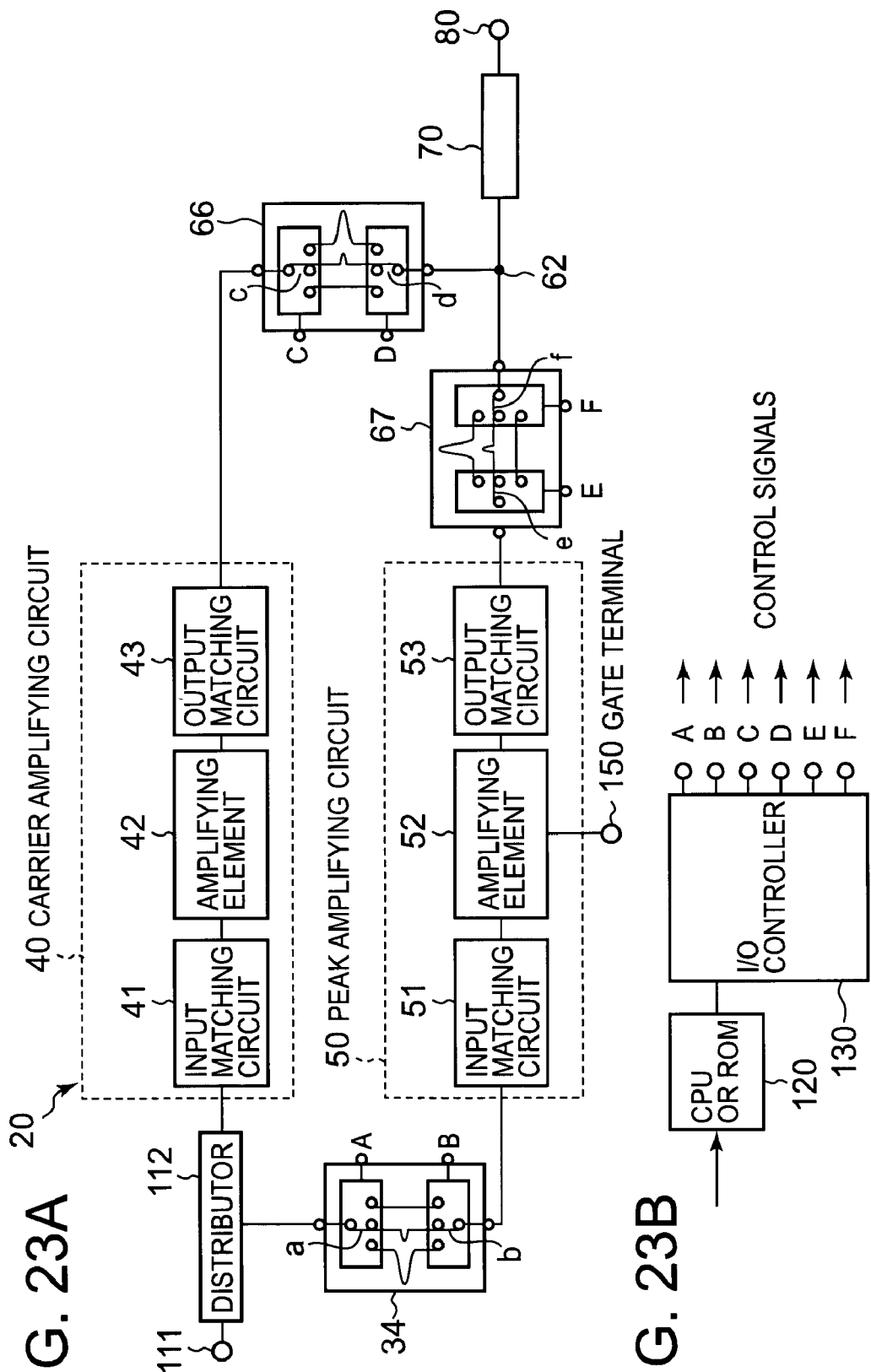
FIG. 23 is a block diagram showing the third configurational example of the Doherty amplifier in the embodiment.

FIGS. 23(*a*) and (*b*) are block diagrams showing the third configurational example of the Doherty amplifier 20. This third configurational example is such that, in the Doherty amplifier 20 shown in FIG. 22, a phase shifter 34 and impedance transformers 66 and 67 are respectively used instead of the phase shifter 33 and the impedance transformers 64 and 65. The remaining configuration is basically the same.

Any of the phase shifter 34 and the impedance transformers 66 and 67 is such that a plurality of transmission lines (here, of three sorts) of different lengths and switches are combined.

The individual transmission lines have the lengths which are optimized so as to make the performance of the amplifier best, in accordance with a plurality of frequencies previously expected to be used. Besides, they are not limited to ones which are formed by providing conductor patterns on a wiring board, but they may well employ semi-rigid cables whose lengths can easily be finely adjusted every device.

The phase shifter 34 is provided with switches a and b and terminals A and B, the impedance transformer 66 is provided with switches c and d and terminals C and D, and the impedance transformer 67 is provided with switches e and f and terminals E and F. Each of the switches a-f is changed-over so as to connect to any of the transmission lines in accordance with a control signal inputted from the corresponding one of the terminals A-F.

Further, a control unit which performs the control of the amplifier shown in FIG. 23(*a*) includes a CPU (or ROM) 120 and an I/O controller 130 which generate control signals, and the terminals A-F of the amplifier shown in FIG. 23(*a*) are connected to the I/O controller 130, as shown in FIG. 23(*b*). Besides, although not shown, the data of the frequencies previously expected to be used and the control signals of the respective terminals for connecting the frequencies to the transmission lines of the corresponding lengths are stored as, for example, a table in the CPU (or ROM) 120.

In addition, when a signal designating the frequency is inputted to the CPU (or ROM) 120, this CPU (or ROM) 120 reads out the control signals stored in correspondence with the designated frequency and outputs them to the terminals A-F. Besides, the switches a-f are respectively changed-over on the basis of the control signals inputted to the terminals A-F, and the transmission lines of the optimal lengths corresponding to the frequency for use are selected.

In accordance with the Doherty amplifier 20 according to the third configurational example, the transmission lines of the optimal lengths are easily selected in accordance with the used frequency, thereby to constitute the phase shifter 34 and the impedance transformers 66 and 67. Therefore, deviations from optimal values attributed to the frequency characteristics of the phase shifter 34 and the impedance transformers 66 and 67 are relieved, and the amplification efficiency of the Doherty amplifier can be enhanced by performing optimal matching irrespective of frequencies, to bring forth the advantage that an applicable frequency band can be expanded. Another advantage is that a cost can be much more curtailed than in a case where dedicated wiring boards are prepared for respective frequency bands.

Incidentally, other amplifying devices with distortion control functions are not restricted to the foregoing embodiments themselves, but they can be incarnated by modifying constituents within a scope not departing from the purports of the embodiments, at the stage of performance.

In accordance with the present invention, a non-linear distortion detection method is so configured that a distortion detection unit equalizes the feedback signal of the output of an amplifier with a reference symbol being an input signal to distortion compensation means, so as to calculate the equalization error between the equalized signal and the reference symbol and to estimate distortions, and hence, an FFT need not be executed in the distortion detection unit. Therefore, sampling need not be performed over a wide band, and the distortions can be detected without increasing a sampling frequency and a calculation amount, to bring forth the advantage that, even when the band of a modulation signal is widened, the increase of a circuit size or consumption power can be suppressed.

In accordance with the invention, a non-linear distortion detection method is so configured that a distortion detection unit changes the amplitude of an input signal to distortion compensation means, cyclically from a low level to a high level, so as to detect and average equalization errors at the respective levels of the amplitude of the input signal and to estimate distortions at the respective levels of the amplitude on the basis of the results of the averaging. Therefore, the distortions are detected as vectors, to bring forth the advantage that convergence can be made fast by employing a distortion compensation algorithm which is faster than a perturbation method.

Besides, in accordance with the invention, a distortion compensation amplifying device is so configured that an A/D converter which samples the feedback signal of the output of a power amplifier at a frequency capable of sampling a frequency band that contains a modulation signal to-be-transmitted and that does not contain intermodulation distortions is included, and that a distortion detection unit is one which includes an equalizer that receives an input signal to a predistorter, as a reference symbol and that equalizes the feedback signal of the power amplifier output by a FIR filter, so as to output the equalization error between the equalized signal and the reference symbol, and an absolute-value averaging portion that outputs as a distortion value, a temporal average value obtained by temporally averaging absolute values of the equalization error over a specified time period. Therefore, a sampling frequency need not be heightened by narrowing the sampling frequency, and the distortions can be detected without increasing a calculation amount, to bring forth the advantage that, even when the band of the modulation signal is widened, the increase of a circuit size or consumption power can be suppressed.

Besides, in accordance with the invention, a distortion compensation amplifying device is so configured that an A/D converter is one which performs sampling at a frequency capable of sampling a frequency band that contains a modulation signal to-be-transmitted and that does not contain intermodulation distortions, and that a distortion detection unit is one which includes a plurality of averaging portions that average an output from an equalizer, at the respective levels of the amplitude of a reference symbol, so as to output the average values as distortion values corresponding to the levels of the amplitude of the reference symbol, and the equalizer that receives an input signal to a predistorter, as the reference symbol, that equalizes the feedback signal of the output of a power amplifier by a FIR filter, that calculates the equalization error between the equalized signal and the reference symbol, that divides the calculated result of the complex conjugate calculation between the equalization error and the reference symbol by the square of the amplitude component of the reference symbol and decides the level of the amplitude of the reference symbol on the basis of the square of the amplitude component of the reference symbol, and that outputs the result of the division to the averaging portion corresponding to the decided level of the amplitude. Therefore, the distortions are detected as vectors, to bring forth the advantage that convergence can be made fast by using a distortion compensation algorithm which is faster than a perturbation method.

Besides, in accordance with the invention, a distortion compensation amplifying device is so configured that a distortion detection unit is one which includes an equalizer that receives an input signal to a predistorter, as a reference symbol, that equalizes the feedback signal of the output of a power amplifier by a FIR filter and that outputs the equalization error between the equalized signal and the reference symbol, as a distortion value. Therefore, an FFT in distortion detection is dispensed with, to bring forth the advantages that a processing amount is decreased and that a distortion compensation of high precision can be made.

Besides, in accordance with the invention, a distortion compensation amplifying device is so configured that a predistorter is one which includes a third-order intermodulation distortion generator, a fifth-order intermodulation distortion generator, a seventh-order intermodulation distortion generator, a first FIR filter corresponding to the third-order intermodulation distortion generator, a second FIR filter corresponding to the fifth-order intermodulation distortion generator, and a third FIR filter corresponding to the seventh-order intermodulation distortion generator, and that a control unit is one which updates the tap coefficients of the first, second and third FIR filters of the predistorter on the basis of distortion values outputted from a distortion detection unit. Accordingly, there is the advantage that a distortion compensation of high precision can be made in the predistorter.

Besides, in accordance with the invention, a distortion compensation amplifying device is so configured that first, second and third step gains which determine response rates for updating the tap coefficients of the first, second and third FIR filters, respectively, are set so as to become the first step gain>the second step gain>the third step gain. Therefore, the coefficients in the FIR filters can be converged in the order of a third-order distortion, a fifth-order distortion and a seventh-order distortion, to bring forth the advantage that the stability of the convergence can be enhanced.

The present invention is applied to the power amplifier of a radio communication transmitter, and it is particularly suited to a non-linear distortion detection method and a distortion compensation amplifying device in which, even when the band of a modulation signal is widened, a sampling frequency need not be heightened, and distortions can be detected without increasing a circuit size or consumption power.

What is claimed is:

1. A non-linear distortion detection method in a distortion compensation amplifying device including:
   an amplifier which subjects an input signal to power amplification;
   distortion compensation means for compensating non-linear distortions which appear in the amplifier, as to an inputted modulation signal to be amplified;
   a distortion detection unit which detects distortion components contained in an output of the amplifier and estimates the distortions, on the basis of a feedback signal of the amplifier output; and
   a control unit which controls the distortion compensation means on the basis of the estimation of the distortions in the distortion detection unit; wherein:
   the distortion detection unit equalizes the feedback signal of the amplifier output with a reference symbol being an input signal to the distortion compensation means, it calculates an equalization error between the equalized signal and the reference symbol, and it estimates the distortions on the basis of the equalization error; and the distortion detection unit changes an amplitude of the input signal to the distortion compensation means, cyclically from a low level to a high level, it detects equalization errors at the respective levels of the amplitude of the input signal and averages the detected equalization errors, and it estimates distortions at the respective amplitude levels on the basis of results of the averaging.

2. A distortion compensation amplifying device including:
a power amplifier which subjects an input signal to power amplification;
a predistorter which compensates non-linear distortions that appear in the power amplifier, as to an inputted modulation signal to be transmitted;
an A/D converter which samples a feedback signal of an output of the power amplifier at a specified frequency;
a distortion detection unit which detects distortion components contained in the power amplifier output, on the basis of the A/D-converted feedback signal, and which outputs the distortion components as distortion values; and
a control unit which controls the predistorter on the basis of the distortion values; wherein:
the A/D converter samples the feedback signal at a frequency capable of sampling a frequency band that contains the modulation signal to be transmitted and that does not contain intermodulation distortions; and
the distortion detection unit includes:
a plurality of averaging portions that average an output from an equalizer, at respective levels of an amplitude of a reference symbol, and that output the average values as the distortion values corresponding to the levels of the amplitude of the reference symbol; and
the equalizer that receives an input signal to the predistorter, as the reference symbol, that equalizes the feedback signal of the power amplifier output by a FIR filter, that calculates an equalization error between the equalized signal and the reference symbol, that divides a calculated result of a complex conjugate calculation between the equalization error and the reference symbol, by a square of an amplitude component of the reference symbol and decides the level of the amplitude of the reference symbol on the basis of the square of the amplitude component of the reference symbol, and that outputs a result of the division to the averaging portion corresponding to the decided level of the amplitude.

3. The distortion compensation amplifying device according to claim 2, wherein the distortion detection unit includes an LMS portion that updates a tap coefficient of the FIR filter in conformity with an LMS algorithm.

4. The distortion compensation amplifying device according to claim 3, wherein the LMS portion updates the tap coefficient with reference to the reference symbol every plurality of sample time periods.

5. A distortion compensation amplifying device including:
a power amplifier which subjects an input signal to power amplification;
a predistorter which compensates non-linear distortions that appear in the power amplifier, as to an inputted modulation signal to be transmitted;
an A/D converter which samples a feedback signal of an output of the power amplifier at a specified frequency;
a distortion detection unit which detects distortion components contained in the power amplifier output, on the basis of the A/D-converted feedback signal, and which outputs the distortion components as distortion values; and
a control unit which controls the predistorter on the basis of the distortion values; wherein:
the distortion detection unit includes an equalizer that receives the input signal to the predistorter, as a reference symbol, that equalizes the feedback signal of the power amplifier output by a FIR filter, and that outputs an equalization error between the equalized signal and the reference symbol, as the distortion value;
the predistorter includes a third-order intermodulation distortion generator, a fifth-order intermodulation distortion generator, a seventh-order intermodulation distortion generator, a first FIR filter corresponding to the third-order intermodulation distortion generator, a second FIR filter corresponding to the fifth-order intermodulation distortion generator, and a third FIR filter corresponding to the seventh-order intermodulation distortion generator; and
the control unit updates tap coefficients of the first, second and third FIR filters of the predistorter on the basis of the distortion values outputted from the distortion detection unit.

6. The distortion compensation amplifying device according to claim 5, wherein first, second and third step gains which determine response rates for updating the tap coefficients of the first, second and third FIR filters, respectively, are set so as to become the first step gain>the second step gain>the third step gain.

7. A distortion compensation amplifying device including:
a power amplifier which subjects an input signal to power amplification;
a predistorter which compensates non-linear distortions that appear in the power amplifier, as to an inputted modulation signal to be transmitted;
an A/D converter which samples a feedback signal of an output of the power amplifier at a specified frequency;
a distortion detection unit which detects distortion components contained in the power amplifier output, on the basis of the A/D-converted feedback signal, and which outputs the distortion components as distortion values; and
a control unit which controls the predistorter on the basis of the distortion values; wherein:
the A/D converter samples the feedback signal at a frequency capable of sampling a frequency band that contains the modulation signal to be transmitted and that does not contain intermodulation distortions;
the distortion detection unit includes an equalizer that receives an input signal to the predistorter, as a reference symbol, that equalizes the feedback signal of the power amplifier output by a FIR filter and that outputs an equalization error between the equalized signal and the reference symbol, and an absolute-value averaging portion that outputs as the distortion value, a temporal average value obtained by temporally averaging absolute values of the equalization error over a specified time period;
the distortion detection unit includes an LMS portion that updates a tap coefficient of the FIR filter in conformity with an LMS algorithm; and
the LMS portion updates the tap coefficient with reference to the reference symbol every plurality of sample time periods.

* * * * *